US012733281B2

(12) United States Patent
Cheng et al.

(10) Patent No.: US 12,733,281 B2
(45) Date of Patent: Sep. 8, 2026

(54) SEMICONDUCTOR ISOLATION STRUCTURES AND METHODS OF FORMING THE SAME

(71) Applicant: Taiwan Semiconductor Manufacturing Company, Ltd., Hsinchu (TW)

(72) Inventors: Chung-Liang Cheng, Changhua City (TW); Sheng-Chan Li, Tainan City (TW); Sheng-Chau Chen, Tainan City (TW); Chung-Yi Yu, Hsin-Chu (TW); Cheng-Yuan Tsai, Chu-Pei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 649 days.

(21) Appl. No.: 17/814,347

(22) Filed: Jul. 22, 2022

(65) Prior Publication Data

US 2024/0030258 A1 Jan. 25, 2024

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/182* (2025.01); *H10F 39/8053* (2025.01); *H10F 39/8063* (2025.01)

(58) Field of Classification Search
CPC ............. H01L 21/76224; H10F 39/807; H10F 39/014; H10F 39/011
See application file for complete search history.

(56) References Cited

U.S. PATENT DOCUMENTS

| | | | | |
|---|---|---|---|---|
| 9,508,769 | B1 * | 11/2016 | Li | H10F 39/8053 |
| 2017/0133414 | A1 * | 5/2017 | Chiang | H10F 39/199 |
| 2019/0096681 | A1 * | 3/2019 | Wei | H01L 21/32134 |
| 2021/0399028 | A1 * | 12/2021 | Wang | H10F 39/805 |

OTHER PUBLICATIONS

Ott, R. D., et al. "The pulse thermal processing of nanocrystalline silicon thin-films." JOM 56 (2004): 45-47. (Year: 2004).*

* cited by examiner

*Primary Examiner* — Jacob Y Choi
*Assistant Examiner* — Aaron Michael Wegner
(74) *Attorney, Agent, or Firm* — Harrity & Harrity, LLP

(57) ABSTRACT

Doping a liner of a trench isolation structure with fluorine reduces dark current from a photodiode. For example, the fluorine may be added to a passivation layer surrounding a backside deep trench isolation structure. As a result, sensitivity of the photodiode is increased. Additionally, breakdown voltage of the photodiode is increased, and a quantity of white pixels in a pixel array including the photodiode are reduced.

20 Claims, 28 Drawing Sheets

SEMICONDUCTOR ISOLATION STRUCTURES AND METHODS OF FORMING THE SAME

BACKGROUND

A complementary metal oxide semiconductor (CMOS) image sensor may include a plurality of pixel sensors. A pixel sensor of the CMOS image sensor may include a transfer transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
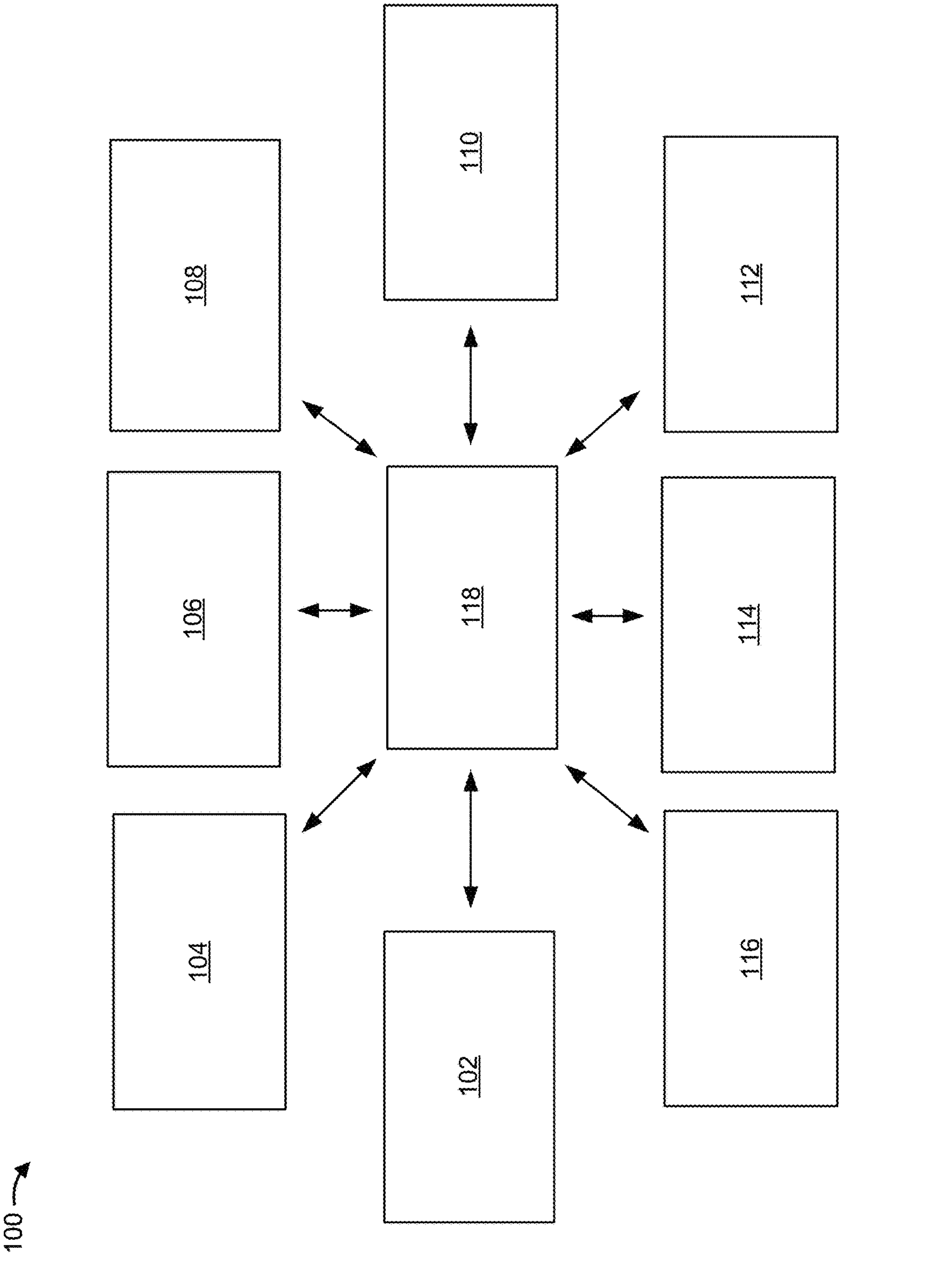
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photodiodes are often separated by trench isolation structures. For example, a backside deep trench isolation (BDTI) structure and/or a high-k material (also referred to as "HK1") may electrically isolate photodiode regions. However, dark current from the photodiodes into the trench isolation structures still persists and reduces the sensitivity and breakdown voltage of the photodiodes. Dark current may result in white pixels that are defective because the pixels always appear white.

Some implementations described herein provide techniques and apparatuses for doping a liner of a trench isolation structure with fluorine (F) such that dark current from a photodiode is reduced. For example, the fluorine may be added to a passivation layer surrounding a BDTI structure. As a result, sensitivity of the photodiode is increased. Additionally, breakdown voltage of the photodiode is increased, and a quantity of white pixels in a pixel array including the photodiode are reduced.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, an annealing tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form, in a substrate, a photodiode for a pixel sensor of a pixel array; form, in the substrate, a trench adjacent to the photodiode; form a doping layer over the liner layer; drive fluorine from the doping layer into the liner layer; remove the doping layer; and fill the trench with a dielectric material over the liner layer to form a deep trench isolation (DTI) structure, among other examples. As another example, one or more of the semiconductor processing tools 102-116 and/or the wafer/die transport tool 118 may form, in a substrate, a photodiode for a pixel sensor of a pixel array; form, in the substrate, a trench adjacent to the photodiode; form a liner layer on sidewalls of the trench and on a bottom surface of the trench; soak the liner layer using a nitrogen fluoride; drive fluorine from the nitrogen fluoride into the liner layer; and fill the trench with a dielectric material over the liner layer to form a DTI structure, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
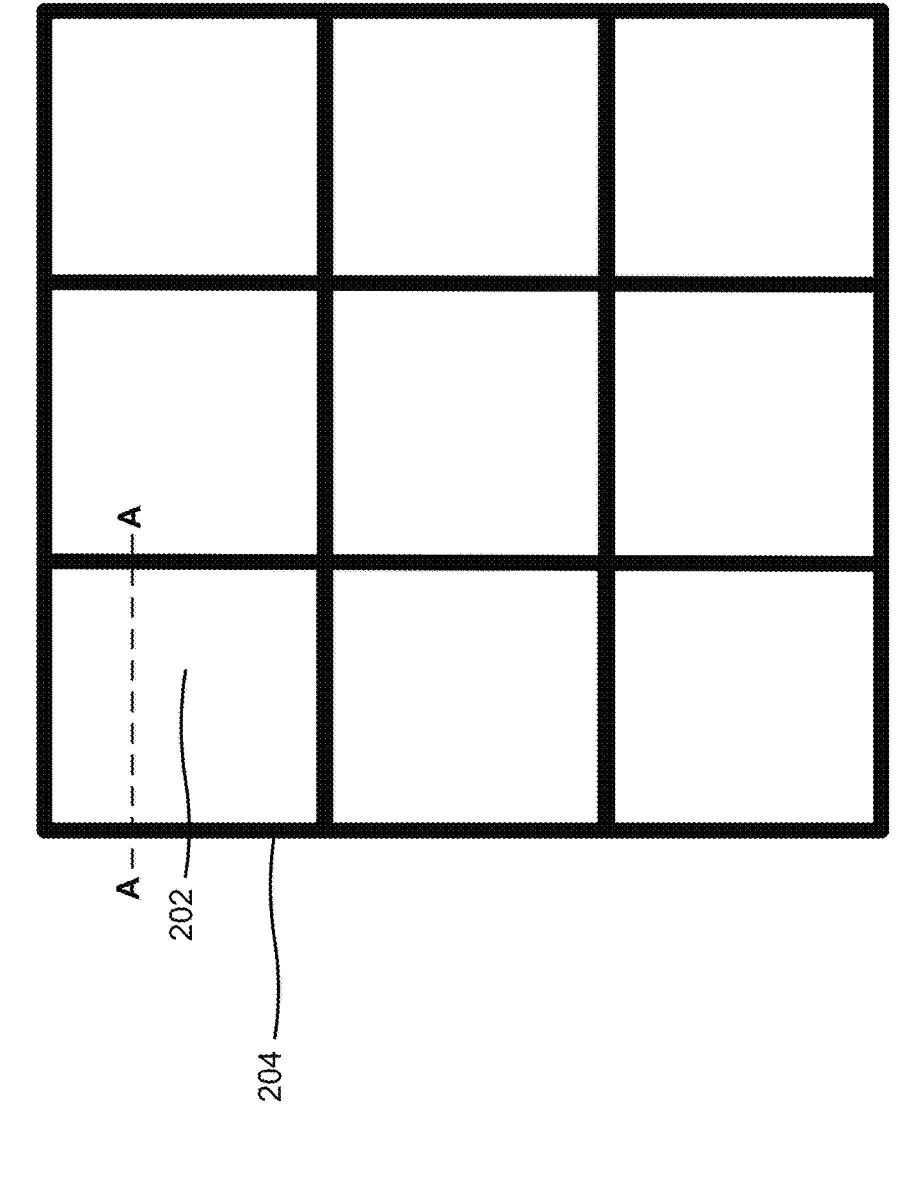
FIG. 2 is a diagram of an example pixel array described herein.

FIG. 2 is a diagram of an example pixel array 200. FIG. 2 illustrates a top-down view of the pixel array 200. In some implementations, the pixel array 200 may be included in an image sensor. The image sensor may include a complementary metal oxide semiconductor (CMOS) image sensor, a backside illuminated (BSI) CMOS image sensor, a front side illuminated (FSI) CMOS image sensor, or another type of image sensor. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as rectangle shapes, circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

In some implementations, the size of the pixel sensors 202 (e.g., the width or the diameter) of the pixel sensors 202 is approximately 1 micron. In some implementations, the size of the pixel sensors 202 (e.g., the width or the diameter) of the pixel sensors 202 is less than approximately 1 micron. In these examples, the pixel sensors 202 may be referred to as sub-micron pixel sensors. Sub-micron pixel sensors may decrease the pixel sensor pitch (e.g., the distance between adjacent pixel sensors) in the pixel array 200, which may enable increased pixel sensor density in the pixel array 200 (which can increase the performance of the pixel array 200).

The pixel sensors 202 may be electrically and optically isolated by a DTI structure 204 included in the pixel array 200. The DTI structure 204 may include a plurality of interconnected trenches that are filled with a dielectric material such as an oxide. The trenches of the DTI structure 204 may be included around the perimeters of the pixel sensors 202 such that the DTI structure 204 surrounds the pixel sensors 202 (and the photodiodes and drain regions included therein), as shown in FIG. 2. Moreover, the trenches of the DTI structure 204 may extend into a substrate in which the pixel sensors 202 are formed to surround the photodiodes and other structures of the pixel sensors 202 in the substrate. As indicated above, the pixel array 200 may be included in a BSI CMOS image sensor. In these examples, the DTI structure 204 may include a backside DTI (BDTI or BSDTI) structure with a high aspect ratio that is formed from the backside of the pixel array 200.

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal. For a BSI CMOS image sensor, the transistor layer may be located between the BEOL metallization stack layers and a lens layer. For a FSI CMOS image sensor, the BEOL metallization stack layers may be located between the transistor layer and the lens layer.

FIG. 2 further illustrates a reference cross-section A-A that is used in one or more figures described herein, such as one or more of FIGS. 3A, 3B, 4, 5A-5M, and 5T. Cross-section A-A is in a plane across a pixel sensor 202 of the pixel array 200. Subsequent figures refer to this reference cross-section for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

Figure 3A:
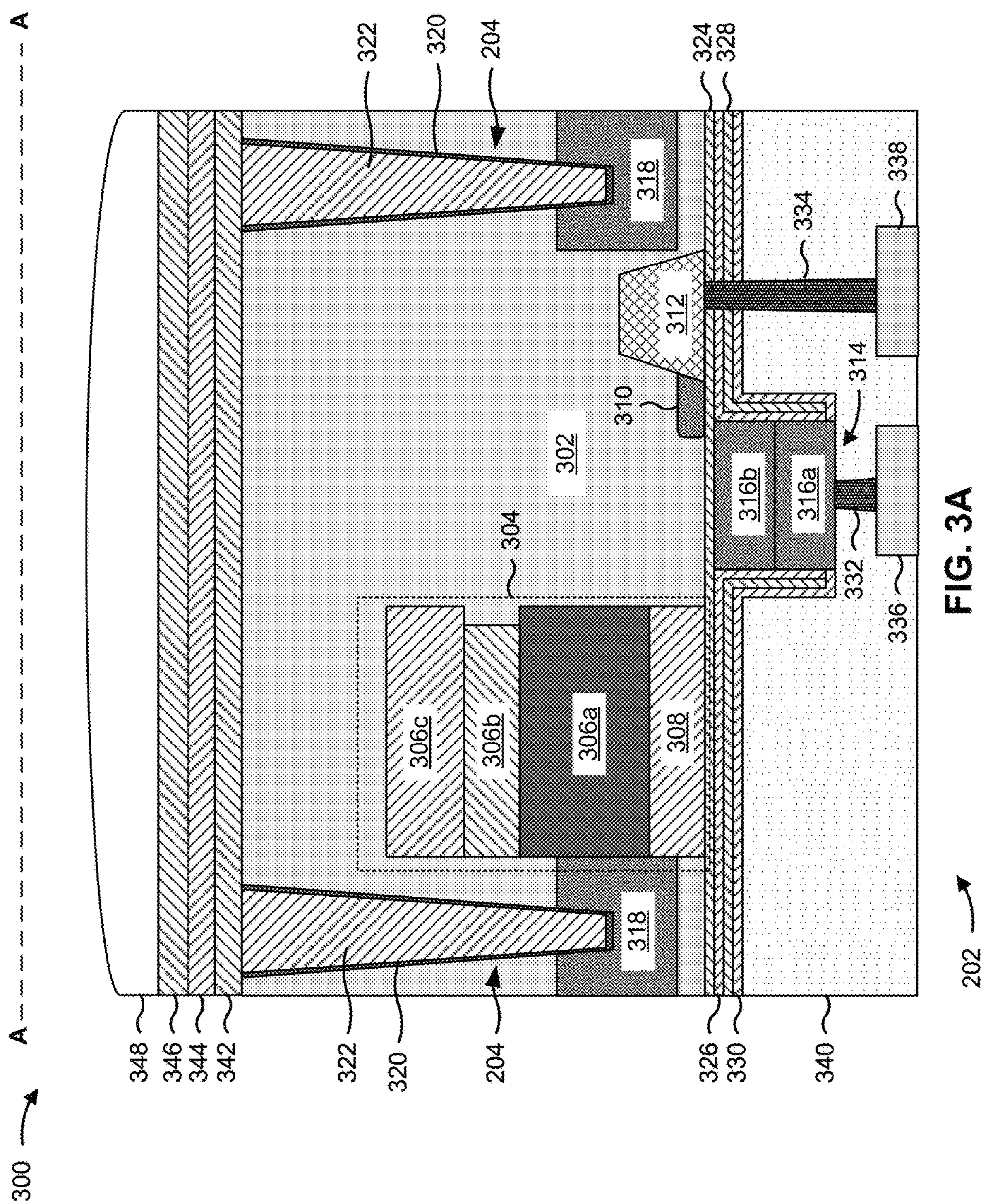
FIGS. 3A-3B are diagrams of examples of a pixel sensor described herein.
Figure 3B:
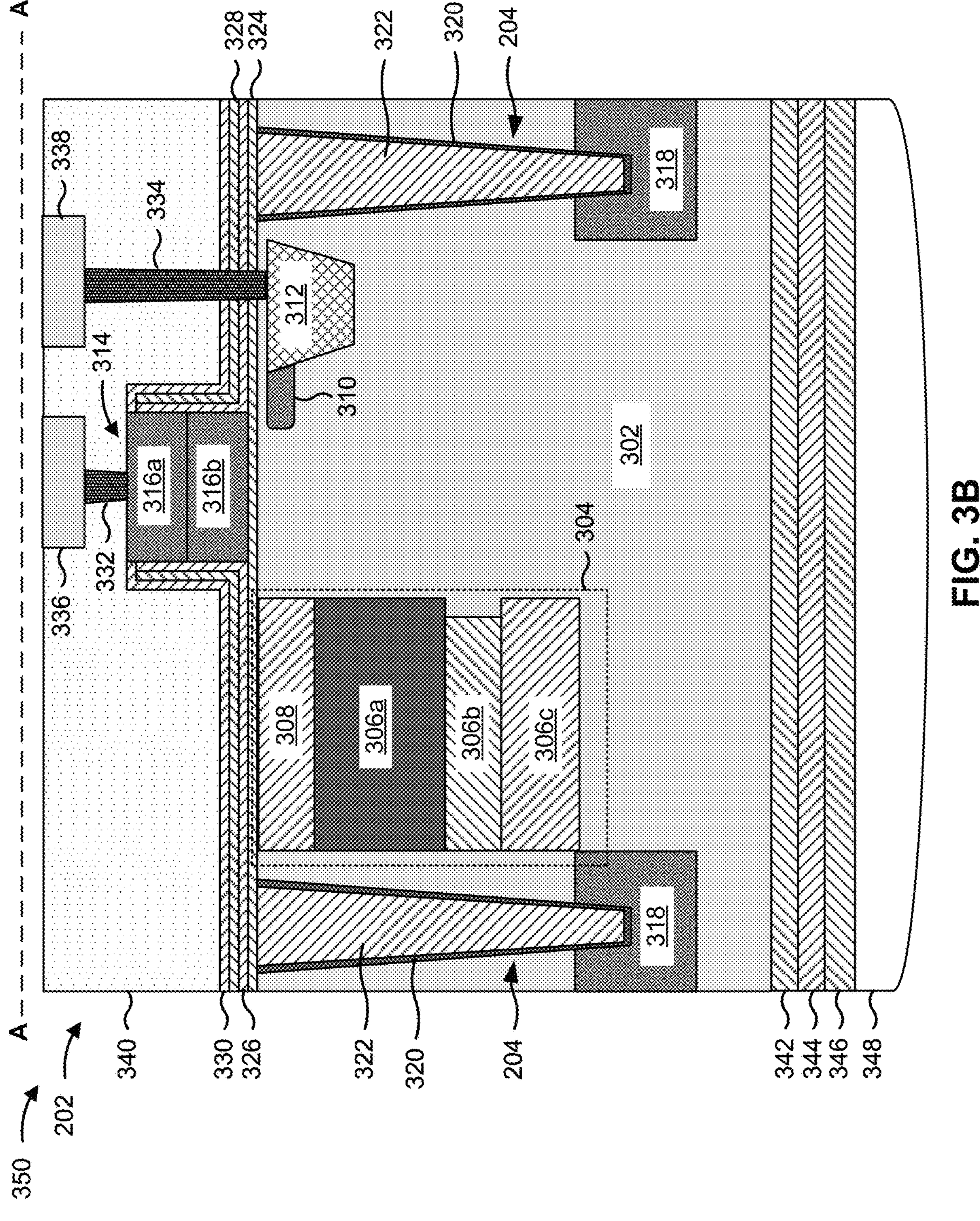

FIGS. 3A and 3B are diagrams of example configurations s of a pixel sensor 202 described herein. In particular, FIGS. 3A and 3B illustrate the example configurations in cross-section views of the pixel sensor 202 along the cross-section A-A of the pixel array 200 in FIG. 2. In some implementations, the pixel sensor 202 may be included in the pixel array 200. In some implementations, the pixel sensor 202 may be included in an image sensor. The image sensor may be a CMOS image sensor, a BSI CMOS image sensor, or another type of image sensor.

FIG. 3A includes an example configuration 300 of a back side DTI CMOS image sensor (BS-DTI-CIS) configuration for a pixel sensor 202. As shown in FIG. 3A, the pixel sensor 202 may include a substrate 302. The substrate 302 may include a semiconductor die substrate, a semiconductor wafer, a stacked semiconductor wafer, or another type of substrate in which semiconductor pixels may be formed. In some implementations, the substrate 302 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 302 is formed of a doped material (e.g., a p-doped material or an n-doped material) such as a doped silicon.

The pixel sensor 202 may include a photodiode 304 that is included in the substrate 302. The photodiode 304 may include a plurality of regions that are doped with various types of ions to form a p-n junction or a PIN junction (e.g., a junction between a p-type portion, an intrinsic (or undoped) type portion, and an n-type portion). For example, the substrate 302 may be doped with an n-type dopant to form one or more n-type regions 306 of the photodiode 304, and the substrate 302 may be doped with a p-type dopant to form a p-type region 308 of the photodiode 304. The photodiode 304 may be configured to absorb photons of incident light. The absorption of photons causes the photodiode 304 to accumulate a charge (referred to as a photocurrent) due to the photoelectric effect. Photons may bombard the photodiode 304, which causes emission of electrons in the photodiode 304.

The regions included in the photodiode 304 may be stacked and/or vertically arranged. For example, the p-type region 308 may be included over the one or more n-type regions 306. The p-type region 308 may provide noise isolation for the one or more n-type regions 306 and may facilitate photocurrent generation in the photodiode 304. In some implementations, the p-type region 308 (and thus, the photodiode 304) is spaced away (e.g., downward) from a top surface of the substrate 302 to provide noise isolation and/or light-leakage isolation from one or more upper layers of the pixel sensor 202. The gap between the top surface of the substrate 302 and the p-type region 308 may decrease charging of the pixel sensor 202, may decrease the likelihood of plasma damage to the photodiode 304, and/or may reduce the dark current of the pixel sensor 202 and/or the white pixel performance of the pixel sensor 202, among other examples.

The one or more n-type regions 306 may include an n-type region 306*a*, an n-type region 306*b*, and an n-type region 306*c*. The n-type region 306*b* may be located over and/or on the n-type region 306*c*, and the n-type region 306*a* may be located over and/or on the n-type region 306*b*. The n-type region 306*b* and the n-type region 306*c* may be referred to as deep n-type regions or deep n-wells and may extend the n-type region 306 of the photodiode 304. This may provide an increased area for photon absorption in the photodiode 304. Moreover, at least a subset of the one or more n-type regions 306 may have different doping concentrations. For example, the n-type region 306*a* may include a greater n-type dopant concentration relative to the n-type region 306*b* and the n-type region 306*c*, and the n-type region 306*b* may include a greater n-type dopant concentration relative to the n-type region 306*c*. As a result, an n-type dopant gradient is formed, which may increase the migration of electrons upward in the photodiode 304.

The pixel sensor 202 may include a drain extension region 310 and a drain region 312 coupled and/or electrically connected to the drain extension region 310. The drain extension region 310 may be adjacent to the drain region 312. The drain region 312 may include a highly-doped n-type region (e.g., an $n^+$ doped region). The drain extension region 310 may include lightly-doped n-type region(s) that facilitate the transfer of photocurrent from the n-type region 306*a* to the drain region 312. In some implementations, the drain extension region 310 is spaced away (e.g., downward) from a frontside surface of the substrate 302 to provide noise isolation and/or light-leakage isolation from one or more upper layers of the pixel sensor 202. The gap between the frontside surface of the substrate 302 and the drain extension region 310 may increase noise isolation for the drain extension region 310, may decrease random noise and/or random telegraph noise in the pixel sensor 202, may decrease the likelihood of plasma damage to the drain extension region 310, and/or may reduce the dark current of the pixel sensor 202 and/or the white pixel performance of the pixel sensor 202, among other examples.

The pixel sensor 202 may include a transfer gate 314 to control the transfer of photocurrent between the photodiode 304 and the drain region 312. The transfer gate 314 may be energized (e.g., by applying a voltage or a current to the transfer gate 314) to cause a conductive channel to form between the photodiode 304 and the drain extension region 310. The conductive channel may be removed or closed by de-energizing the transfer gate 314, which blocks and/or prevents the flow of photocurrent between the photodiode 304 and the drain region 312.

The transfer gate 314 may include a gate electrode stack that includes an n-doped upper transfer gate electrode region 316*a* and a lower transfer gate electrode region 316*b*. The lower transfer gate electrode region 316*b* may be included over a portion of the frontside surface of the substrate 302, and the n-doped upper transfer gate electrode region 316*a* may be located over and/or on the lower transfer gate electrode region 316*b*. The n-doped upper transfer gate electrode region 318*a* may include a layer of $n^+$ doped polysilicon. The lower transfer gate electrode region 316*b* may include a layer of polysilicon.

The pixel sensor 202 may include a plurality of regions to provide electrical isolation and/or optical isolation between the pixel sensor 202 and adjacent pixel sensors. The pixel sensor 202 may include a deep p-well region (DPW) 318 adjacent to, and at least partially surrounding, the photodiode 304. In some implementations, the pixel sensor 202 further includes a cell p-well region (CPW) above the deep p-well region 318. The deep p-well region 318 (and the cell p-well region, if included) may include a circle or ring shape in a top-down view in the substrate 302. The deep p-well region 318 (and the cell p-well region, if included) may each include a $p^+$ doped silicon material or another $p^+$ doped material.

The DTI structure 204 may be included in the substrate 302 adjacent to the photodiode 304 and the drain region 312. Moreover, the DTI structure 204 may be included above and/or partially in the deep p-well region 318. In some implementations, the DTI structure 204 may be included in a cell p-well region. The DTI structure 204 may include one or more trenches that extend downward into the substrate 302 (e.g., from the backside of the substrate 302), and that are that are adjacent the photodiode 304, the drain extension region 310, and the drain region 312. In a top-down view of the pixel sensor 202, the DTI structure 204 may surround the photodiode 304, the drain extension region 310, and the drain region 312. In other words, the photodiode 304, the drain extension region 310, and the drain region 312 may be included within a perimeter of the DTI structure 204 of the pixel sensor 202. The DTI structure 204 may provide optical isolation between the pixel sensor 202 and one or more adjacent pixel sensors to reduce the amount of optical crosstalk between the pixel sensor 202 and the one or more adjacent pixel sensors. In particular, the DTI structure 204 may absorb, refract, and/or reflect photons of incident light, which may reduce the amount of incident light that travels through a pixel sensor 202 into an adjacent pixel sensor and is absorbed by the adjacent pixel sensor.

The DTI structure 204 may include a liner layer 320 between the substrate 302 of the pixel sensor 202 and an oxide layer 322 of the DTI structure 204. The liner layer 320 may include a metal oxide, such as an aluminum oxide (AlO), among other examples. The liner layer 320 may be included between the substrate 302 and the oxide layer 322.

The oxide layer 322 may function to reflect incident light toward the photodiode 304 to increase the quantum efficiency of the pixel sensor 202 and to reduce optical crosstalk between the pixel sensor 202 and one or more adjacent pixel sensors. In some implementations, the oxide layer 322 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 322. The liner layer 320 may be included to increase reflectivity of the DTI structure 204. In some implementations, one or more additional high-κ layers, such as a hafnium oxide (HfO) and/or a tantalum oxide ($Ta_2O_5$), may be included between the oxide layer 322 and the liner layer 320 to further increase reflectivity.

Formation of the DTI structure 204 results in dangling silicon bonds at an interface between the substrate 302 and the liner layer 320. As a result, dark current may be generated at the DTI structure 204 and flow to the transfer gate 314. When a pixel sensor within the pixel array 200 has higher than usual dark current, the pixel sensor may become a white pixel that does not function properly. Additionally, dark current in general reduces breakdown voltage and sensitivity of the pixel sensor 202. Accordingly, as described in connection with FIGS. 4 and 5A-5T, the liner layer 320 may be doped with fluorine (F). Thus, fluorine atoms migrate to the interface between the substrate 302 and the liner layer 320 and passivate the dangling silicon bonds. As a result, dark current is reduced, which increases breakdown voltage and sensitivity of the pixel sensor 202. Additionally, fewer pixel sensors within the pixel array 200 will be white pixels.

A gate dielectric layer 324 may be included above and/or over the frontside surface of the substrate 302. The lower transfer gate electrode region 316*b* may be included over and/or on the gate dielectric layer 324. The gate dielectric layer 324 may include a dielectric material such as tetraethyl orthosilicate (TEOS) or another type of dielectric material. A sidewall oxide layer 326 may be included over and/or the gate dielectric layer 324 on the frontside surface of the substrate 302. The sidewall oxide layer 326 may also be included on sidewalls of the n-doped upper transfer gate electrode region 316*a* and/or on sidewalls of the lower transfer gate electrode region 316*b*. The sidewall oxide layer 326 may include an oxide such as silicon oxide ($SiO_x$) or another type of oxide material. A remote plasma oxide (RPO) layer 328 may be included over and/or on the sidewall oxide layer 326 over the frontside surface of the substrate 302. The remote plasma oxide layer 328 may also be included over the sidewall oxide layer 326 on the sidewalls of the n-doped upper transfer gate electrode region 316*a* and/or over the sidewall oxide layer 326 on the sidewalls of the lower transfer gate electrode region 316*b*. A contact etch stop layer (CESL) 330 may be included over and/or on the remote plasma oxide layer 328 over the frontside surface of the substrate 302. The contact etch stop layer 330 may also be included over the remote plasma oxide layer 328 on the sidewalls of the n-doped upper transfer gate electrode region 316*a* and/or over remote plasma oxide layer 328 on the sidewalls of the lower transfer gate electrode region 316*b*.

The transfer gate 314 and the drain region 312 may be electrically connected by interconnects 332 and 334, respectively, with respective metallization layers 336 and 338 above the substrate 302. The interconnects 332 and 334, and the metallization layers 336 and 338, may be included in one or more dielectric layers 340. The interconnect 332 may be electrically connected with the transfer gate 314 by the n-doped upper transfer gate electrode region 316*a*. In some implementations, the dielectric layer(s) 340 surround and/or encapsulate the interconnects 332 and 334, as well as the metallization layers 336 and 338. The dielectric layer(s) 340 may include an inter-metal dielectric (IMD) layer formed of an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another type of dielectric material. The interconnects 332 and 334, as well as the metallization layers 336 and 338, may include one or more conductive materials, such as tungsten (W), cobalt (Co), ruthenium (Ru), copper (Cu), and/or another type of conductive material.

As further shown in FIG. 3A, the pixel sensor 202 may include one or more layers on the back side or a bottom side of the substrate 302. On the substrate 302 (e.g., on the bottom of the substrate 302), a $p^+$ ion layer 342 may be included to increase photon-electron conversion. An antireflective coating (ARC) layer 344 may be included above and/or on the $p^+$ ion layer 342. The ARC 344 may include a suitable material for reducing a reflection of incident light projected toward the photodiode 304. For example, the ARC 344 may include nitrogen-containing material.

A color filter layer 346 may be included above and/or on the ARC 344. In some implementations, the color filter layer 346 includes a visible light color filter configured to filter a particular wavelength or a particular wavelength range of visible light (e.g., red light, blue light, or green light). In some implementations, the color filter layer 346 includes a near infrared (NIR) filter (e.g., an MR bandpass filter) configured to permit wavelengths associated with MR light to pass through the color filter layer 346 and to block other wavelengths of light. In some implementations, the color filter layer 346 includes an MR cut filter configured to block MR light from passing through the color filter layer 346. In some implementations, the color filter layer 346 is omitted from the pixel sensor 202 to permit all wavelengths of light to pass through to the photodiode 304. In these examples, the pixel sensor 202 may be configured as a white pixel sensor.

A micro-lens layer 348 may be included above and/or on the color filter layer 346. The micro-lens layer 348 may include a micro-lens for the pixel sensor 202 configured to focus incident light toward the photodiode 304 and/or to reduce optical crosstalk between the pixel sensor 202 and one or more adjacent pixel sensors.

In operation of the pixel sensor 202, a photocurrent generated by photons of incident light absorbed in the photodiode 304 may originate in the one or more n-type regions 306*a*-306*c*. A current (or voltage) may be applied to the transfer gate 314 from the metallization layer 336 through an interconnect 332, the n-doped upper transfer gate electrode region 316*a*, and the lower transfer gate electrode region 316*b*. The current (or voltage) may energize the transfer gate 314, which causes an electric field to form a conductive channel in the substrate 302 between the n-type region 306*a* and the drain extension region 310. The photocurrent may traverse along the conductive channel from the n-type region 306*a* to the drain extension region 310. The photocurrent may traverse from the drain extension region 310 to the drain region 312. The photocurrent may be measured through the interconnect 334 at the metallization layer 338.

FIG. 3B includes an example configuration 350 of a front side DTI CMOS image sensor (FS-DTI-CIS) configuration for a pixel sensor 202. In the example configuration 350, the DTI structure 204 is formed in the substrate 302 from a front side or top side of the substrate 302. In the example configuration 350, the p-type region 308 may be included over the one or more n-type regions 306. The n-type region 306*b* may be included over and/or on the n-type region 306*c*, the n-type region 306*a* may be included over and/or on the n-type region 306*b*. The p-type region 308 may be included over and/or on the n-type region 306*a*.

As further shown in FIG. 3B, the pixel sensor 202 may include one or more layers on the front side or a bottom side of the substrate 302. On the substrate 302 (e.g., on the top of the substrate 302), a $p^+$ ion layer 342 may be included to increase photon-electron conversion. An antireflective coating (ARC) layer 344 may be included above and/or on the $p^+$ ion layer 342. A color filter layer 346 may be included above and/or on the ARC 344. A micro-lens layer 348 may be included above and/or on the color filter layer 346.

As indicated above, FIGS. 3A and 3B are provided as examples. Other examples may differ from what is described with regard to FIGS. 3A and 3B.

Figure 4:
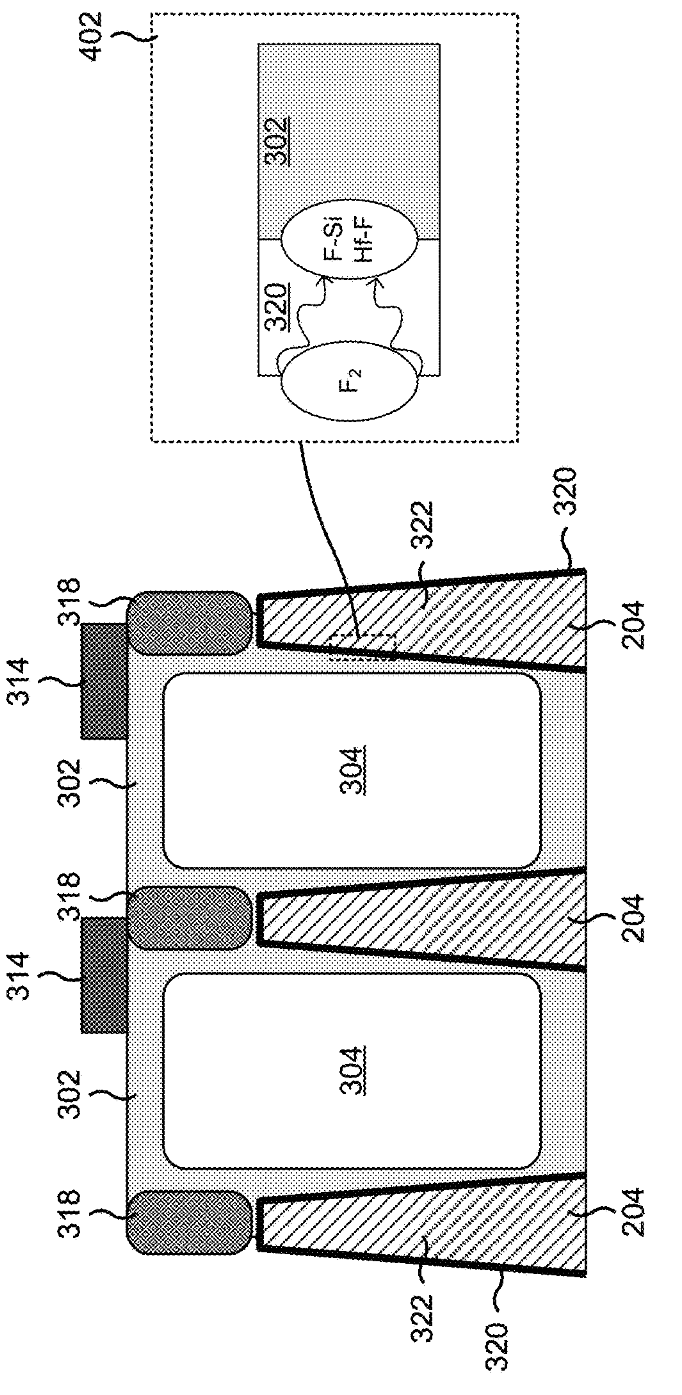
FIG. 4 is a diagram of an example implementation described herein.

FIG. 4 is a diagram of an example of a pixel group 400 described herein. In particular, FIG. 4 illustrates a portion of the pixel array 200 described in connection with FIG. 2. As shown in FIG. 4, the pixel group 400 may include a substrate 302. The substrate 302 may include a semiconductor die substrate, a semiconductor wafer, a stacked semiconductor wafer, or another type of substrate in which semiconductor pixels may be formed.

The pixel group 400 may further include photodiodes 304 that are included in the substrate 302. The pixel group 400 may include a plurality of regions to provide electrical isolation and/or optical isolation between the photodiodes 304. The pixel group 400 may include DPWs 318 adjacent to, and at least partially surrounding, the photodiodes 304. Each DPW 318 may include a circle or ring shape in a top-down view in the substrate 302. The DPWs 318 may each include a $p^+$ doped silicon material or another $p^+$ doped material.

The DTI structures 204 may be included in the substrate 302 adjacent to the photodiodes 304. Moreover, the DTI structures 204 may be included above and/or partially in the DPWs 318. The DTI structures 204 may include one or more trenches that extend downward into the substrate 302 (e.g., from the backside of the substrate 302) and that are adjacent the photodiodes 304. In a top-down view of the pixel group 400, the DTI structures 204 may surround the photodiodes 304. Accordingly, the photodiodes 304 may be included within a perimeter of the DTI structures 204 of the pixel group 400.

The DTI structures 204 may each include a liner layer 320 between the substrate 302 of the pixel group 400 and an oxide layer 322 of the DTI structure. The liner layer 320 may include a metal oxide, such as an aluminum oxide (AlO), among other examples. In some implementations, one or more additional high-κ layers, such as a hafnium oxide (HfO) and/or a tantalum oxide ($Ta_2O_5$), may be included between the oxide layer 322 and the liner layer 320 to further increase reflectivity of the DTI structure.

As shown in a detailed view 402 in FIG. 4, an interface may be included between the liner layer 320 and the substrate 302. The interface may include an aluminum-silicon interface (or another metal-silicon interface). Accordingly, when the liner layer 320 is doped with fluorine (F), fluorine atoms diffuse to the interface and bond with silicon atoms at the interface. As a result, dark current is reduced, which increases breakdown voltage and sensitivity of the pixel group 400. Additionally, fewer pixel sensors within the pixel array 200 will be white pixels.

The transfer gates 314 may each include a gate electrode stack. Accordingly, in operation of the pixel group 400, photocurrents generated by photons of incident light absorbed in the photodiodes 304 may originate in one or more n-type regions of the photodiodes 304. The current (or voltage) may energize the transfer gates 314. Accordingly, the photocurrents may traverse from the n-type regions of the photodiodes 304 to a drain region (not shown) for measurement.

As indicated above, FIG. 4 is provided as an example. Other examples may differ from what is described with regard to FIG. 4.

Figure 5A:
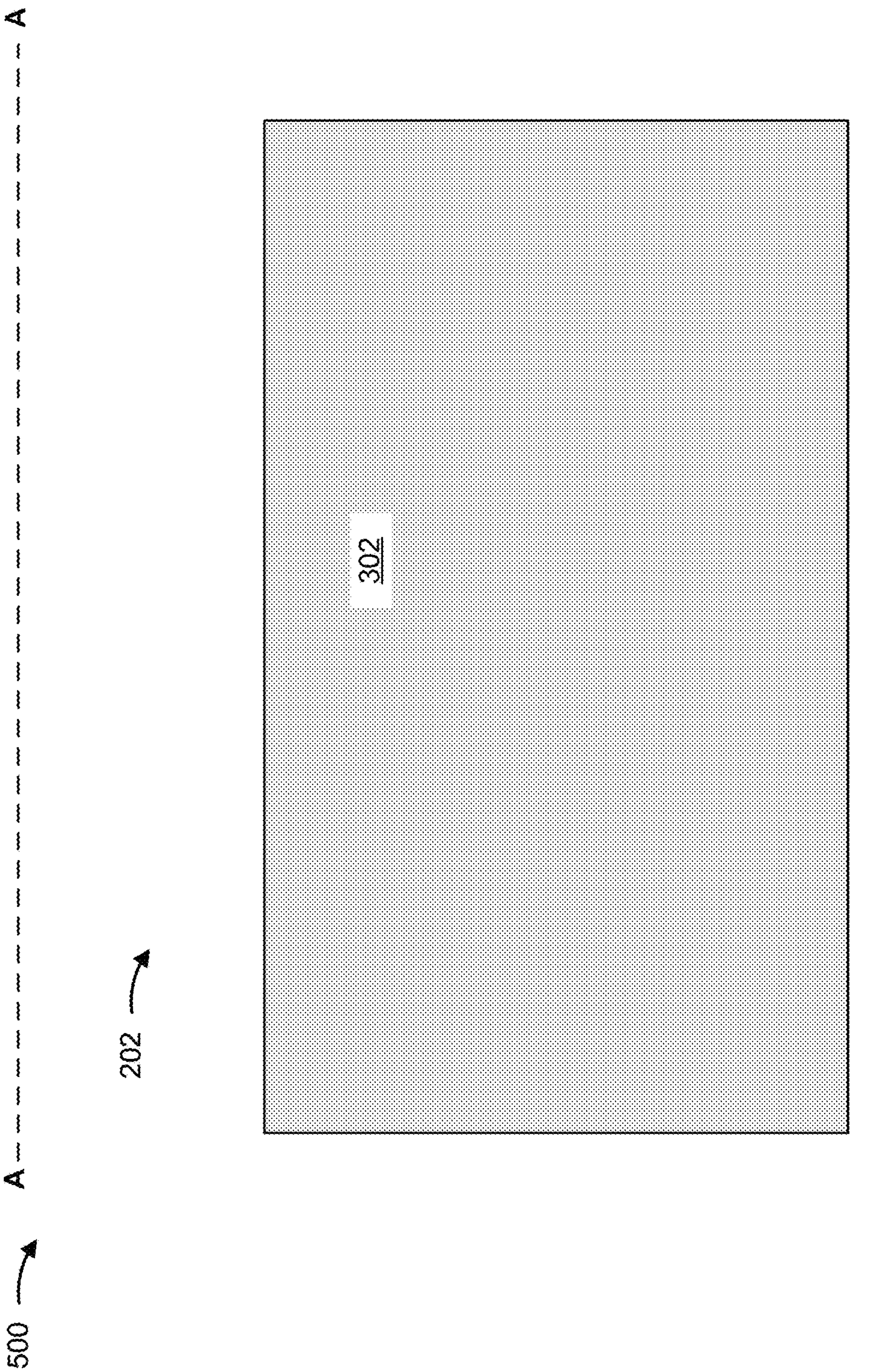
FIGS. 5A-5T are diagrams of an example implementation described herein.
Figure 5B:
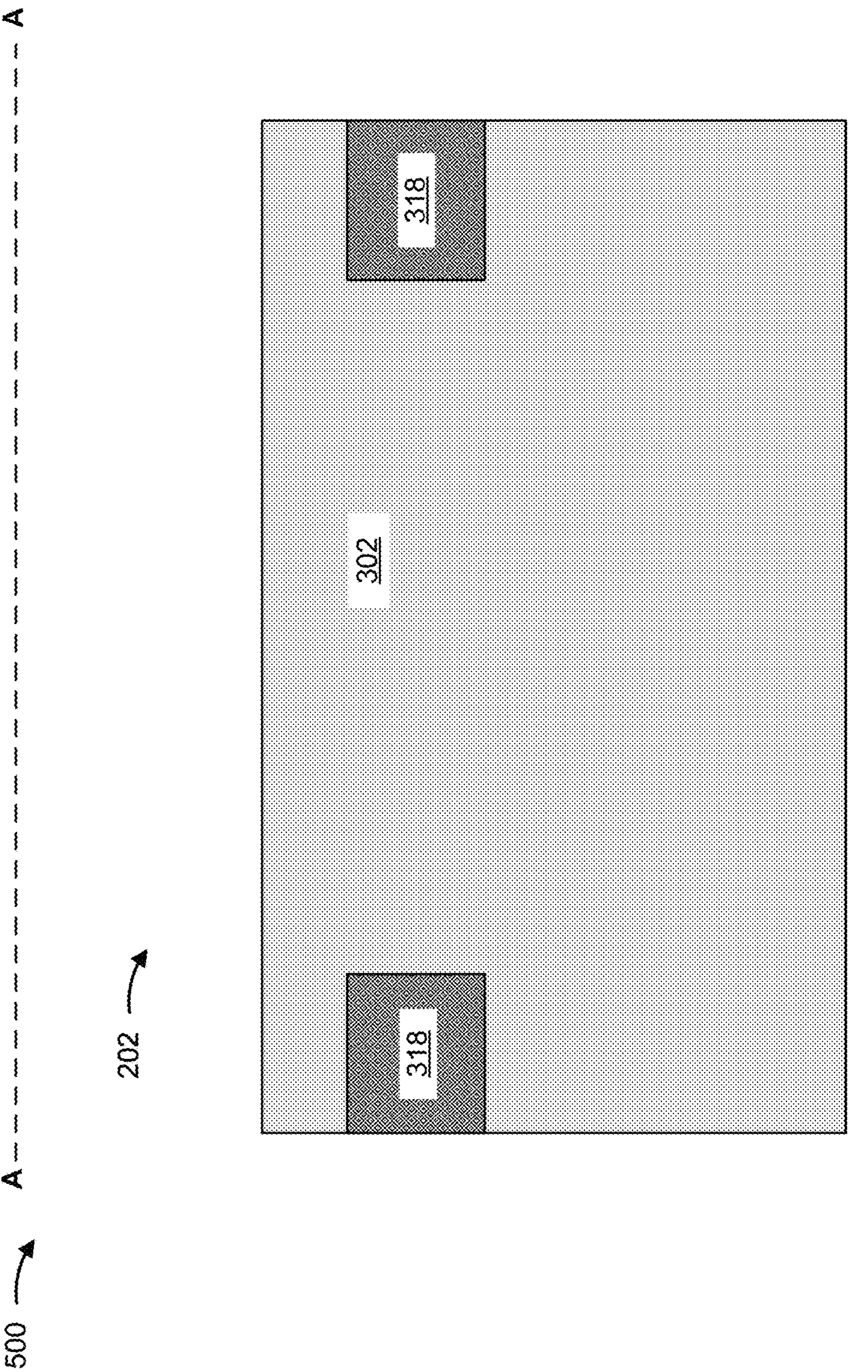
Figure 5C:
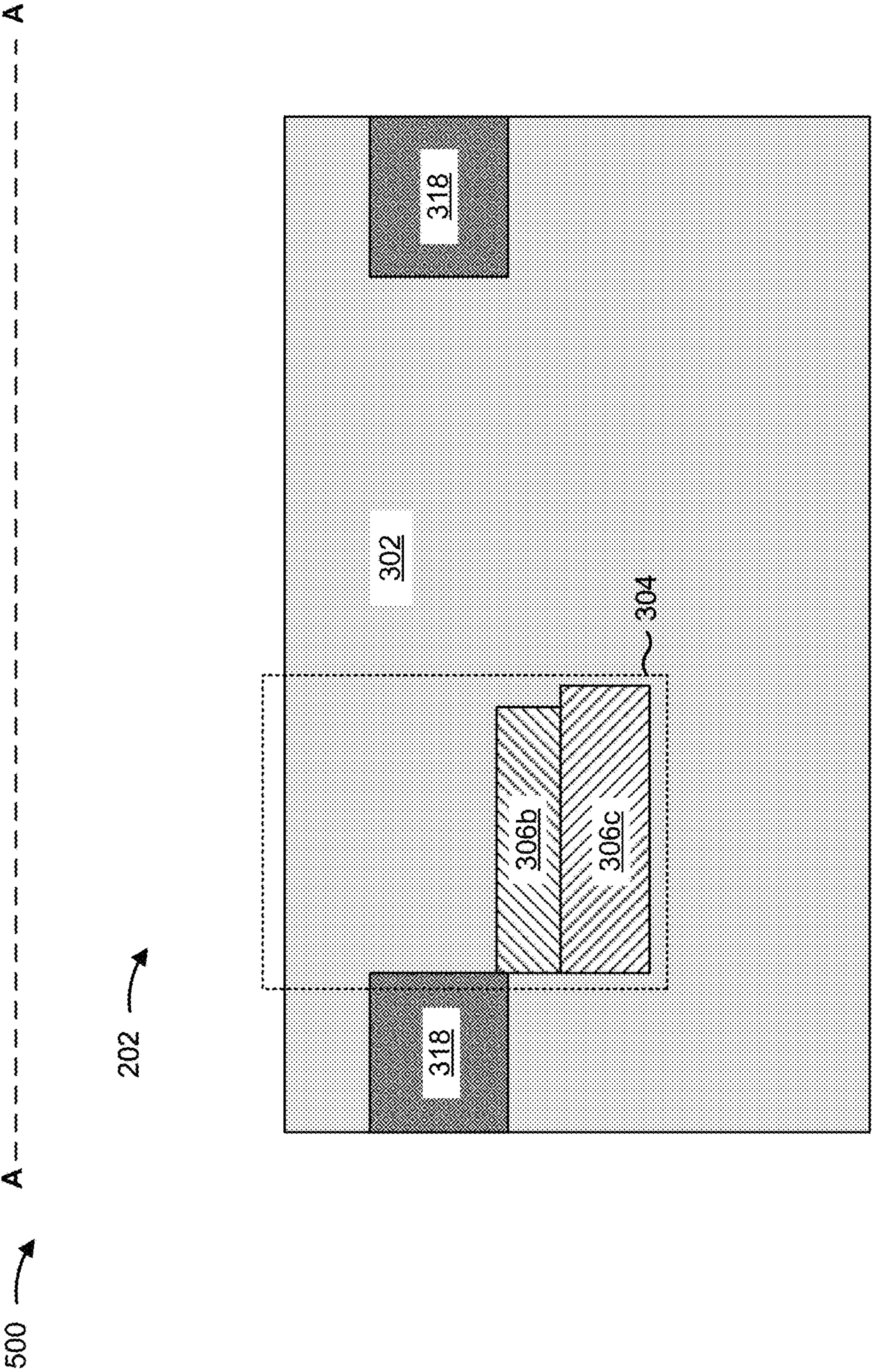
Figure 5D:
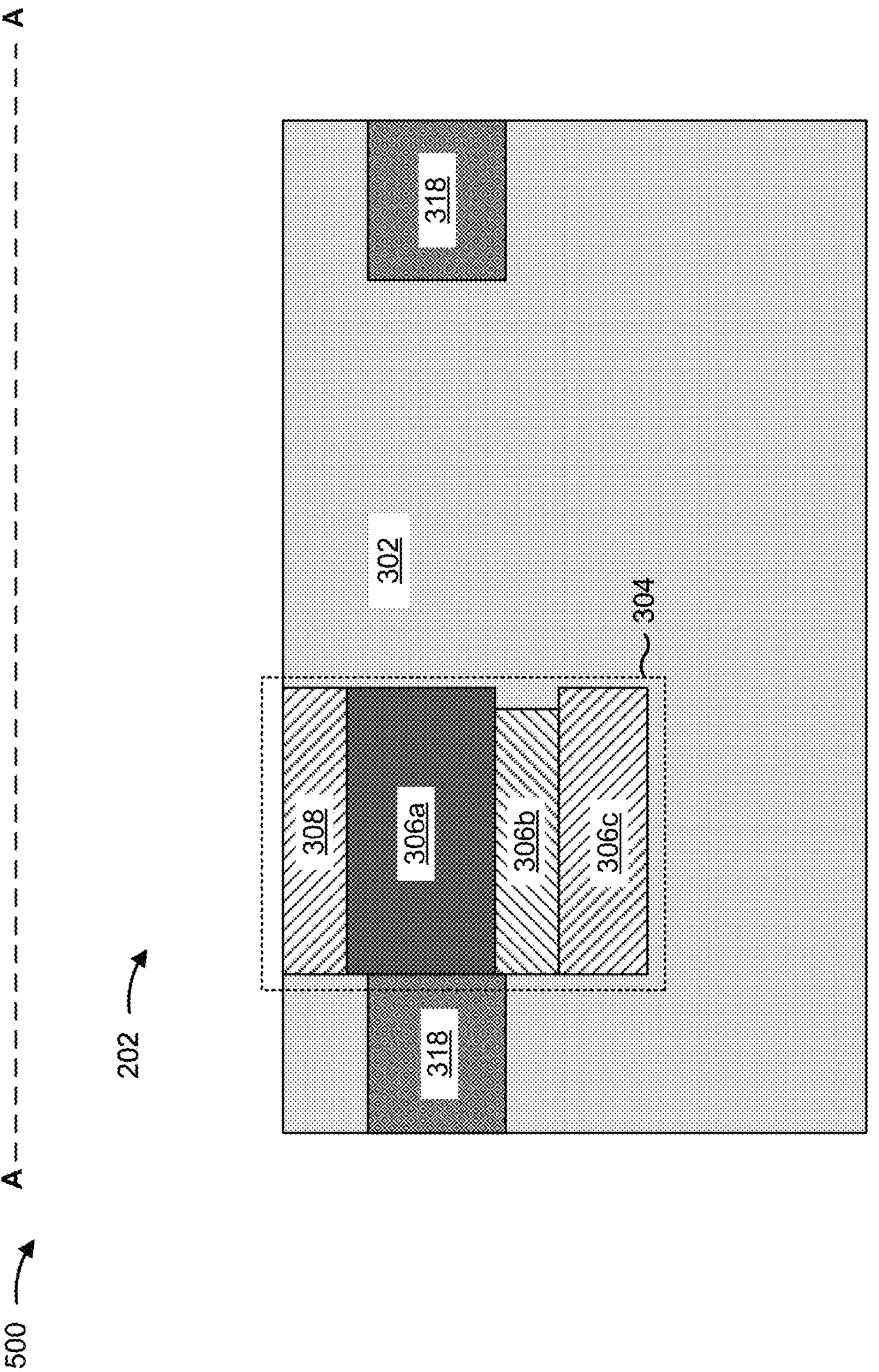
Figure 5E:
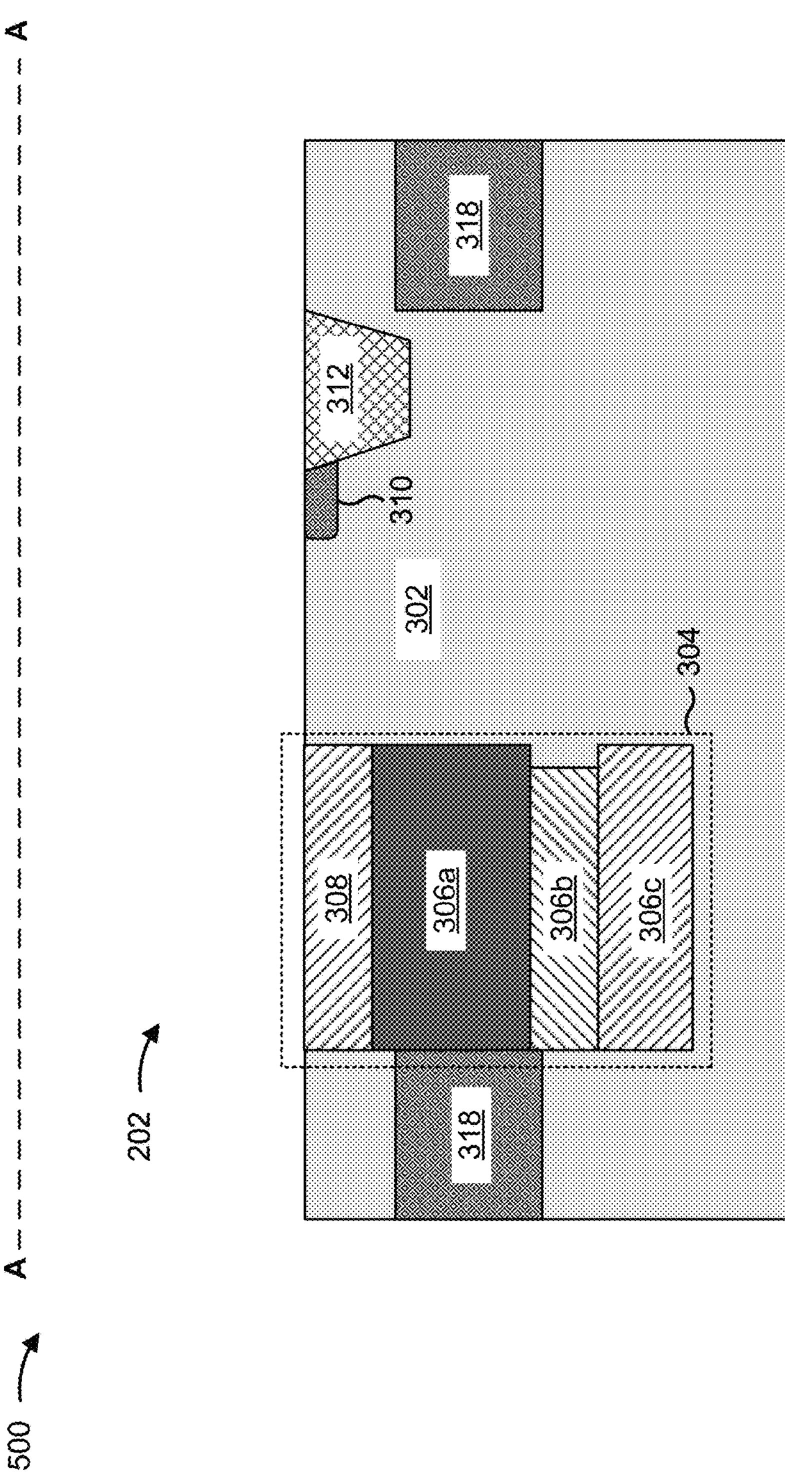
Figure 5F:
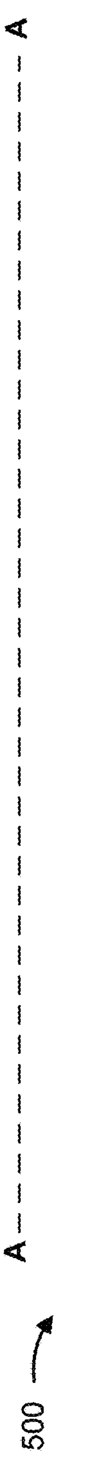
Figure 5F:
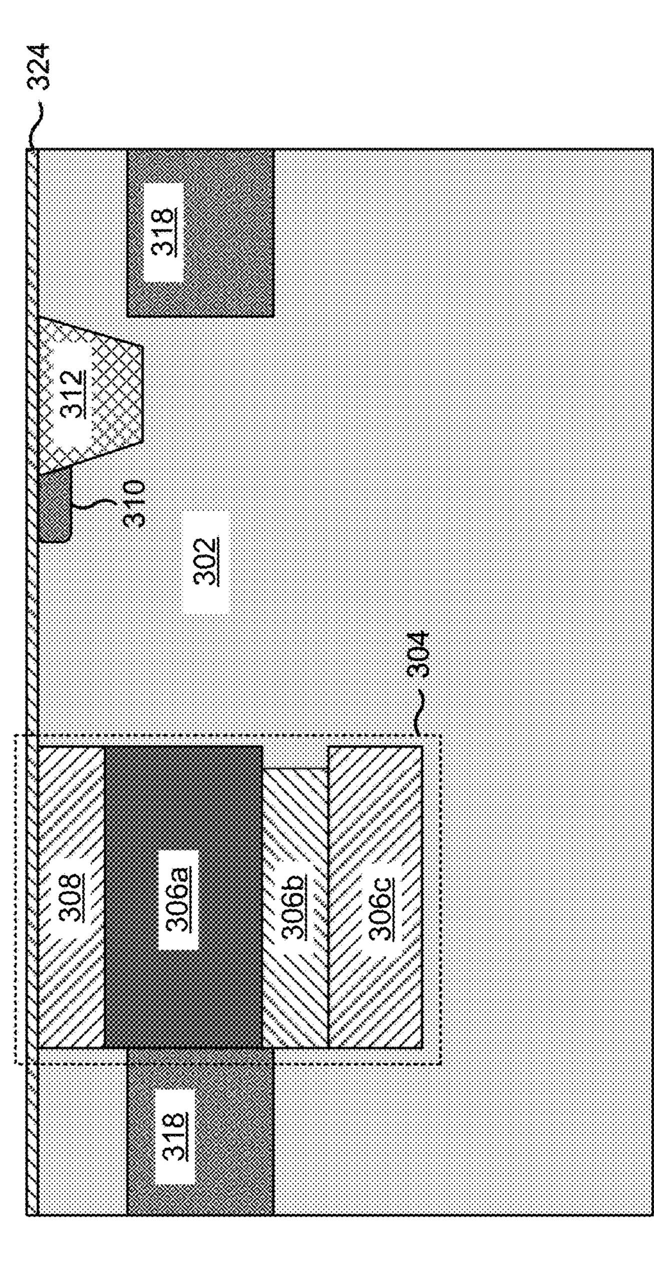
Figure 5G:
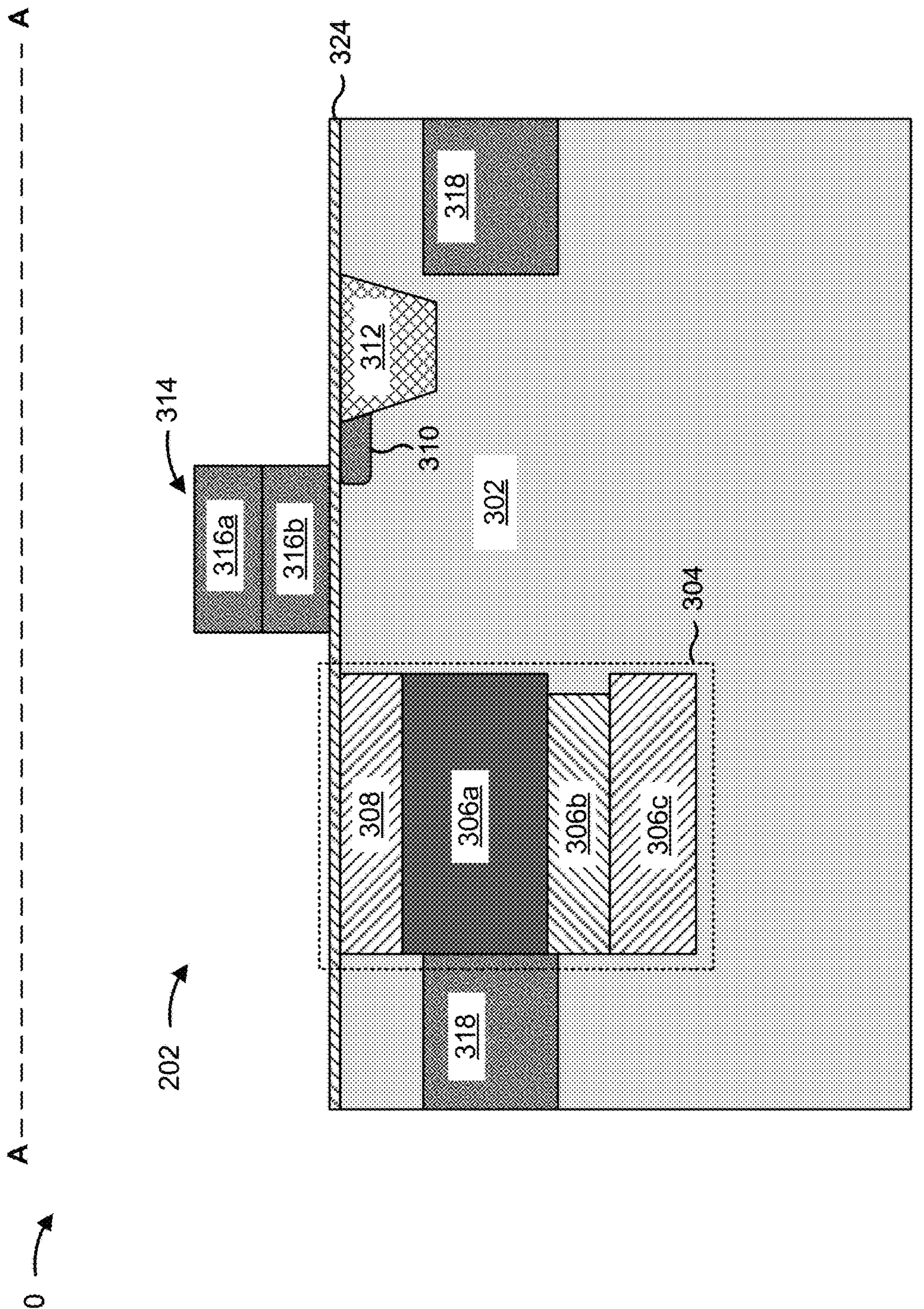
Figure 5H:
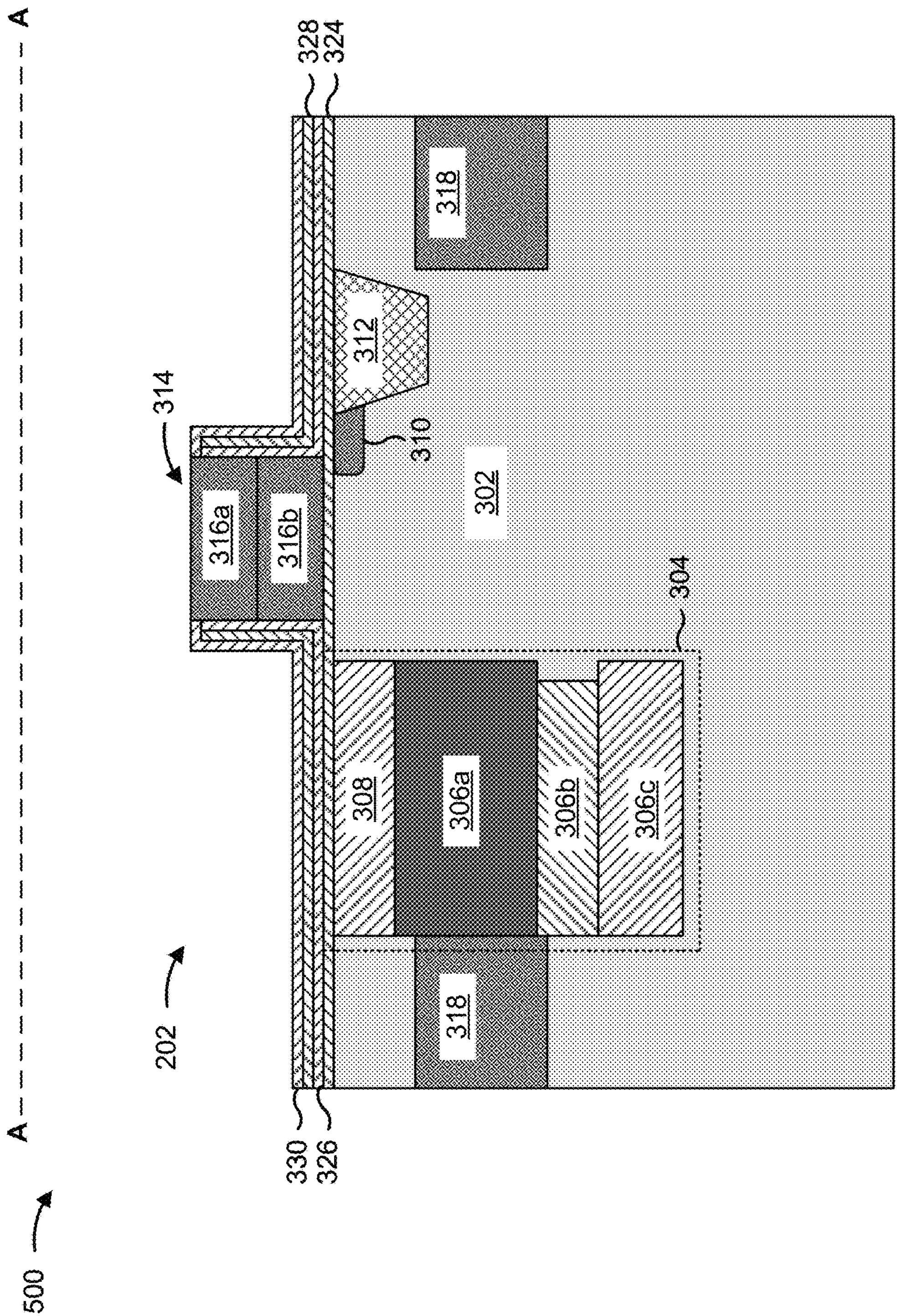
Figure 5I:
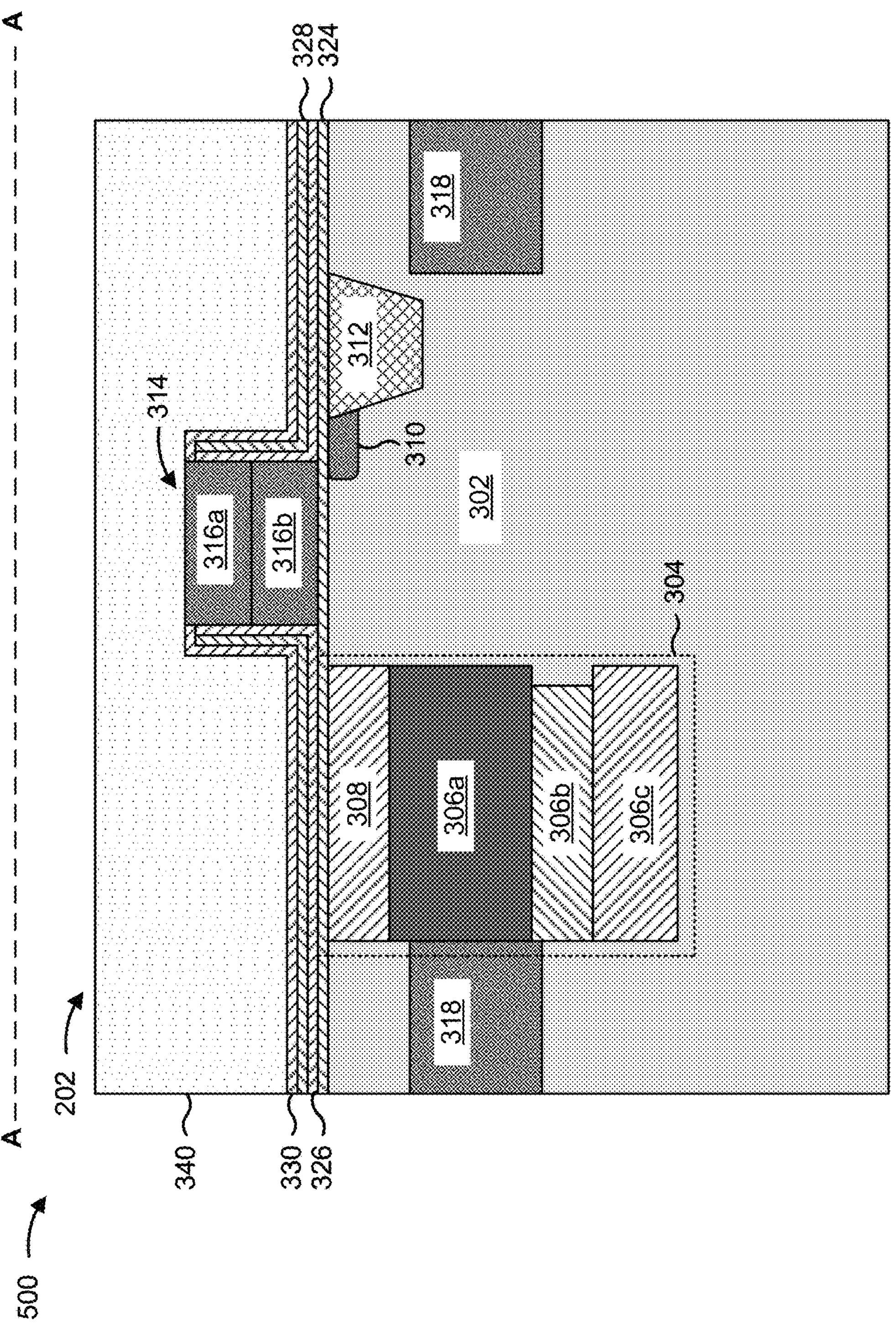
Figure 5J:
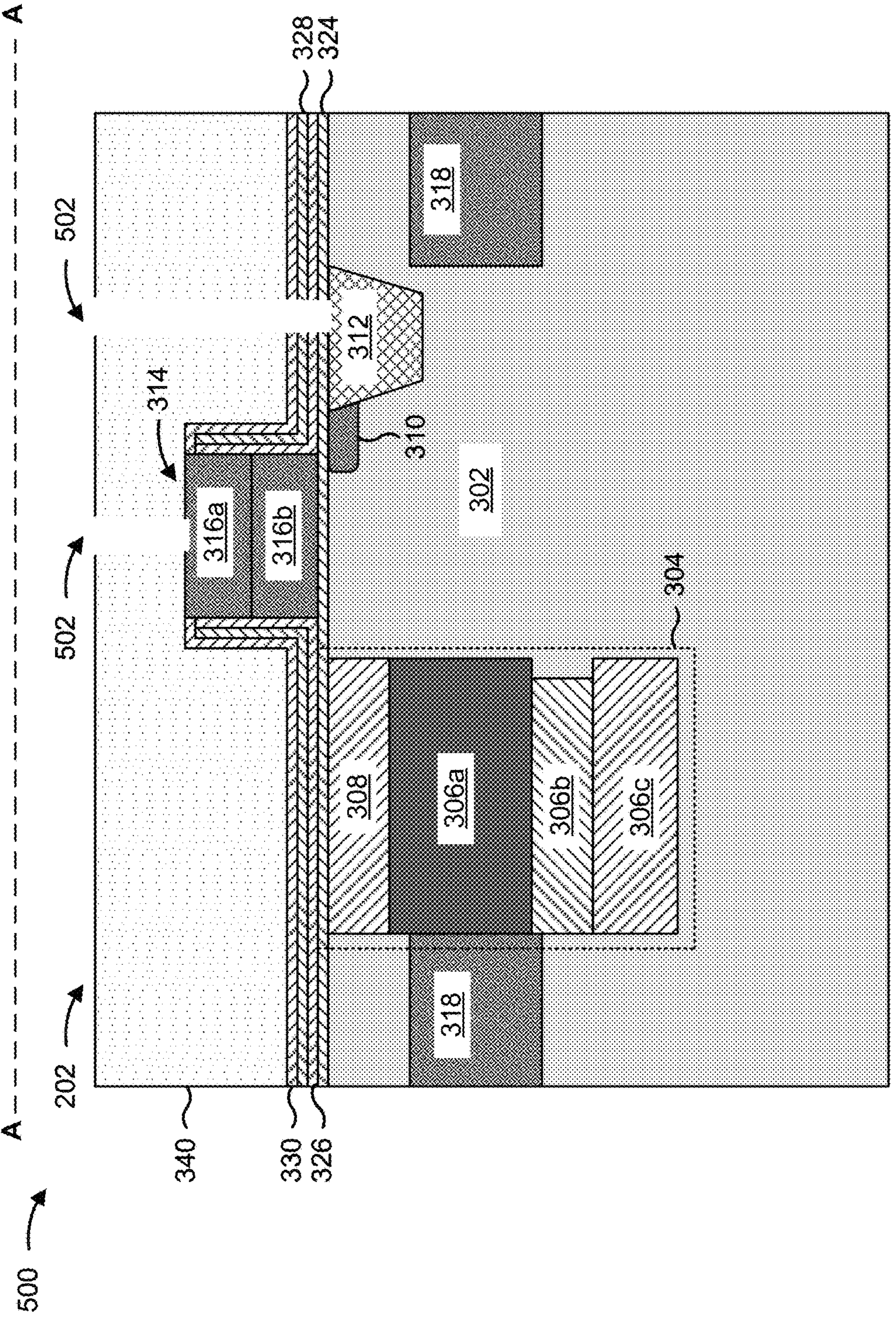
Figure 5K:
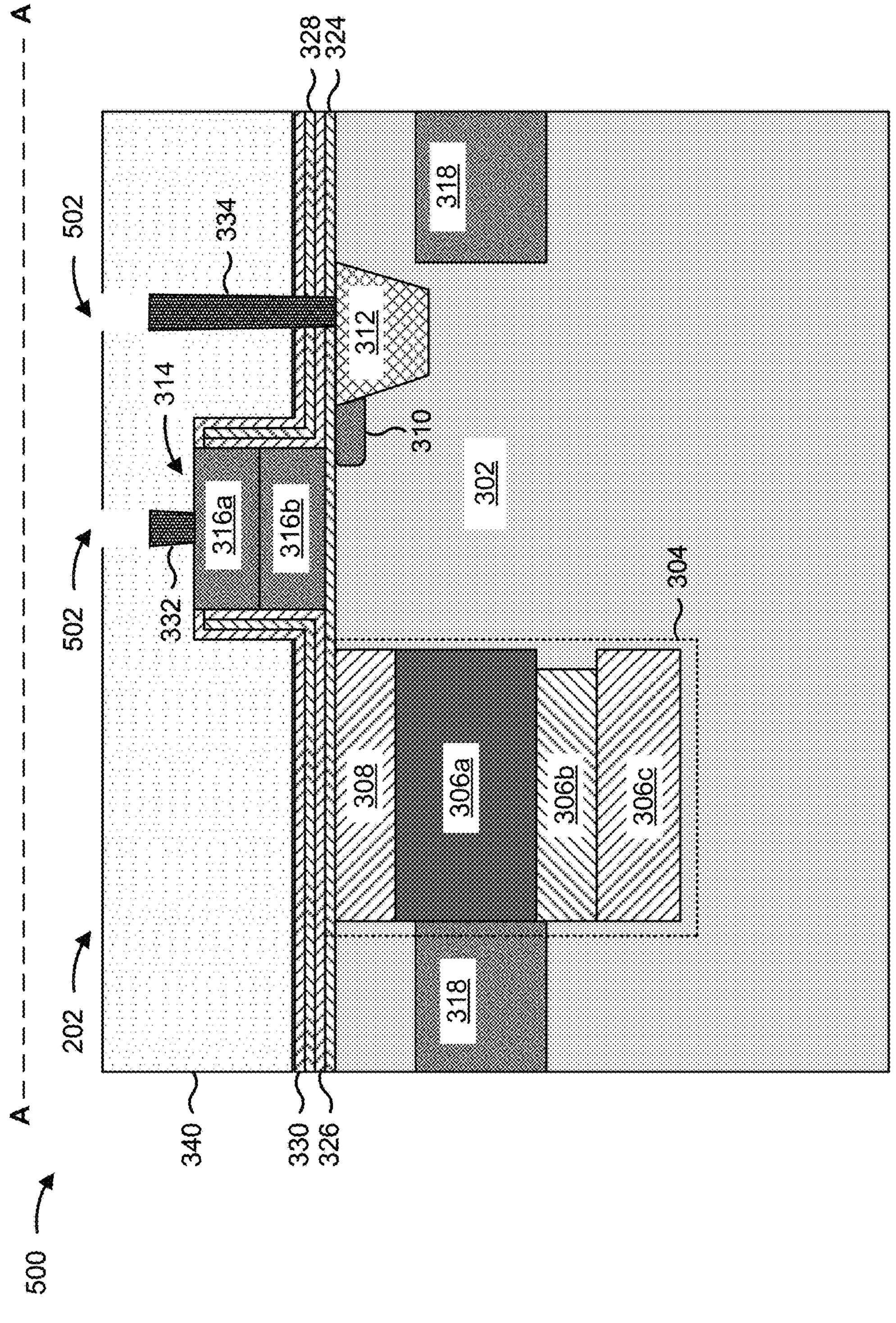
Figure 5L:
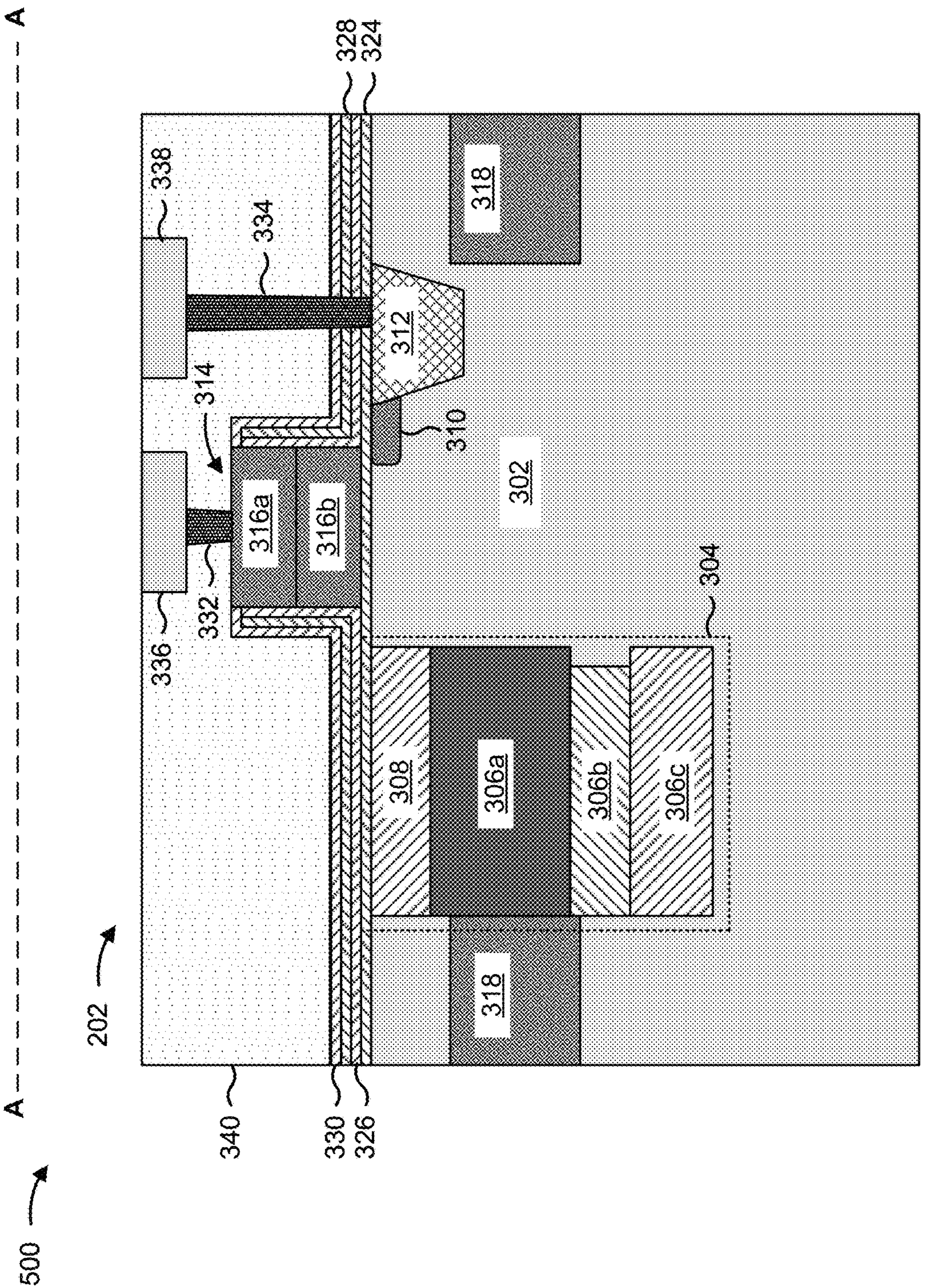
Figure 5M:
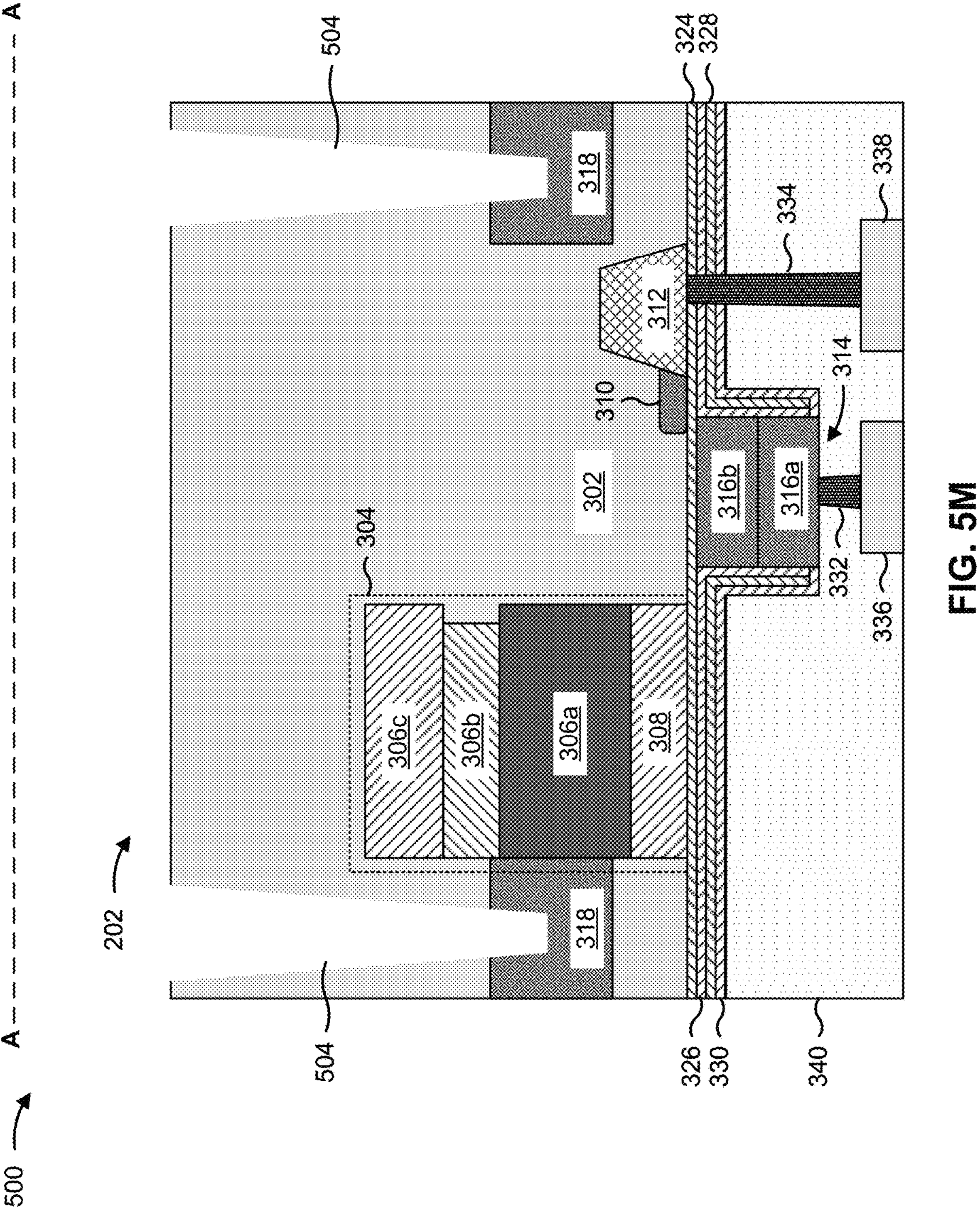
Figure 5N:
Figure 5N:
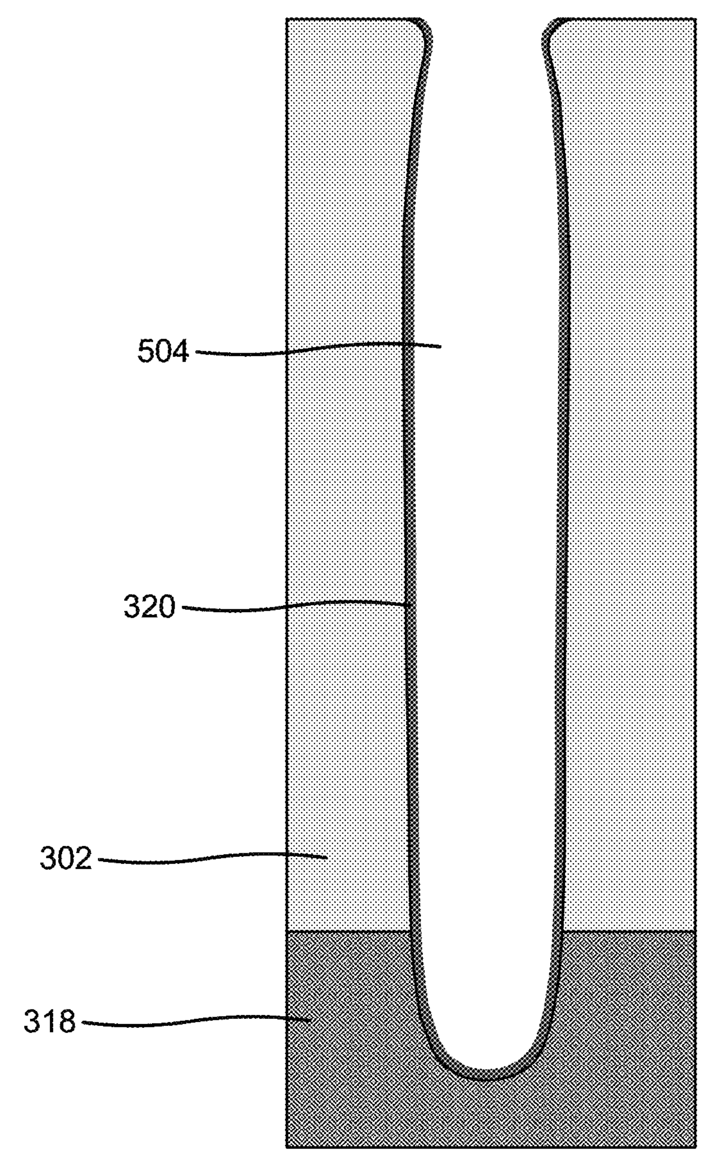
Figure 5O:
Figure 5O:
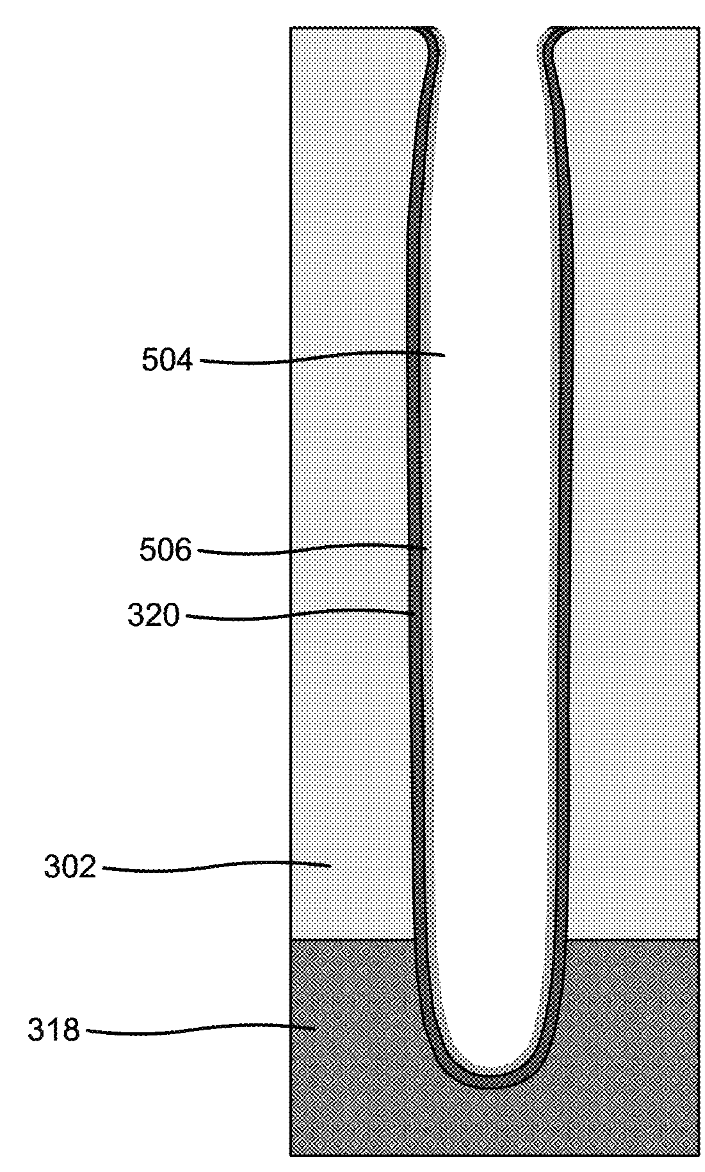
Figure 5P:
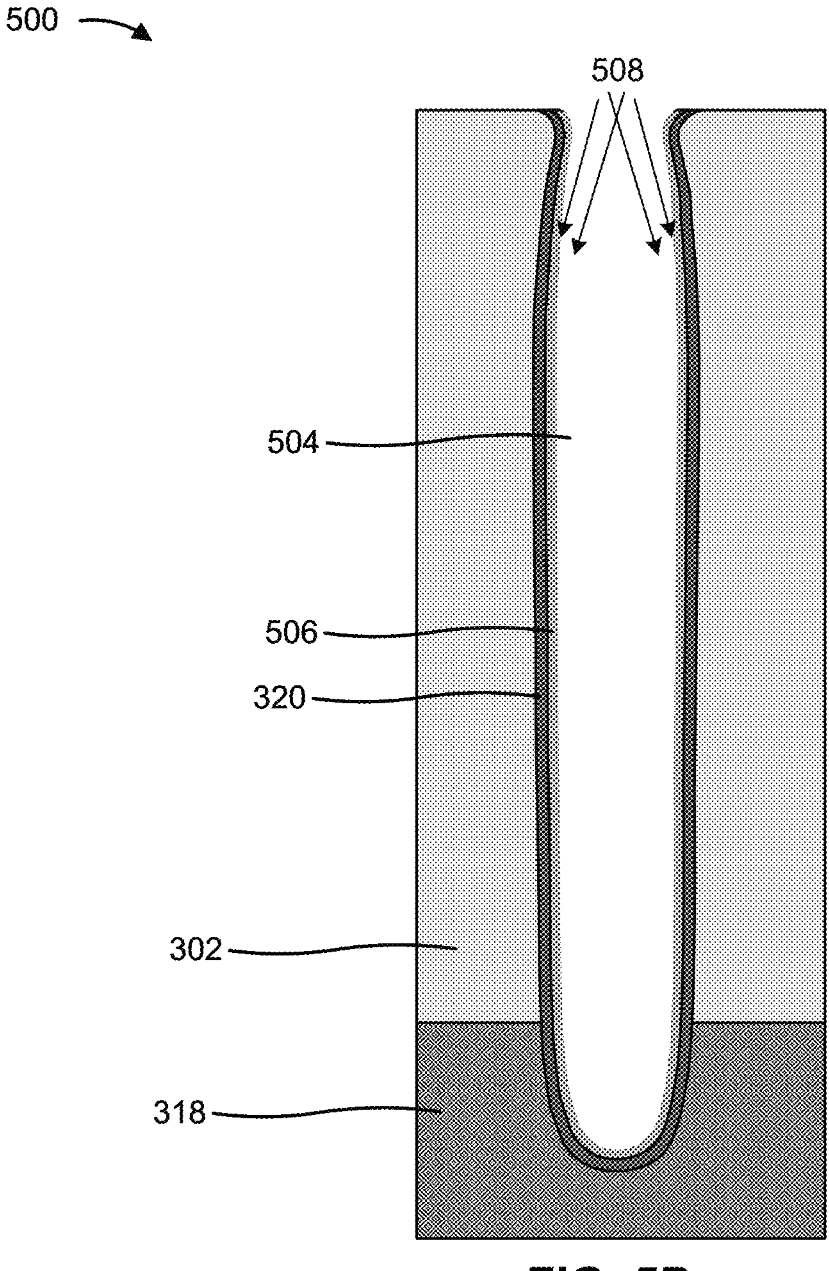
Figure 5Q:
Figure 5Q:
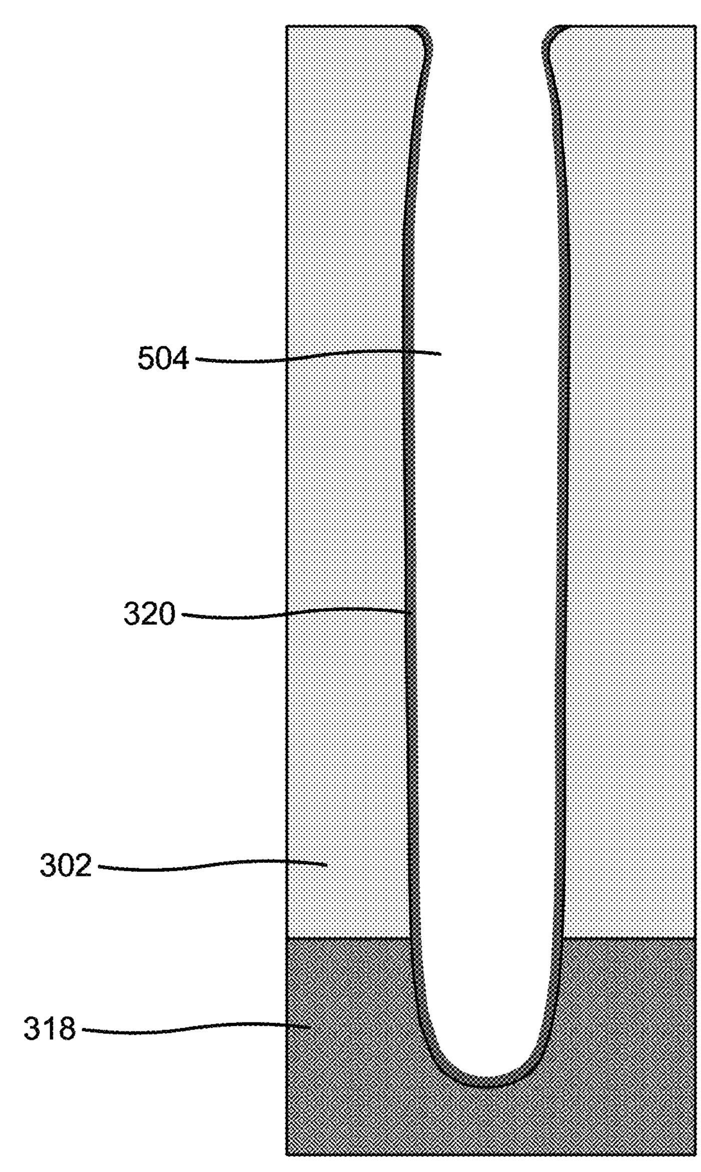
Figure 5R:
Figure 5R:
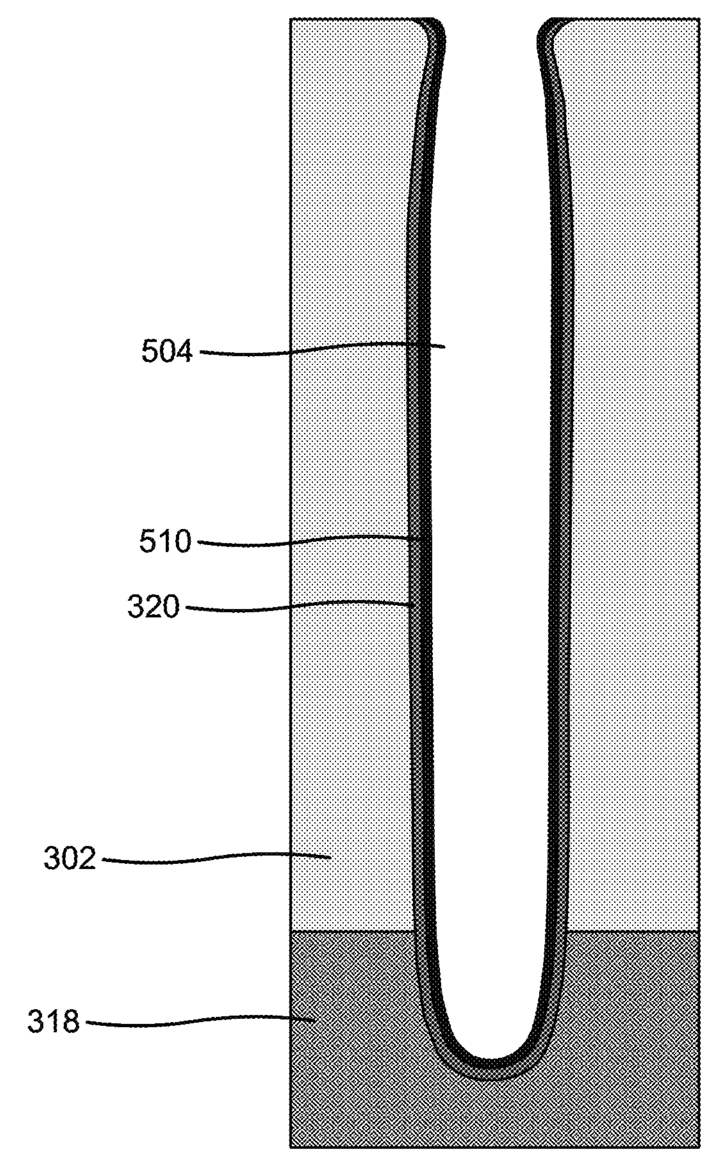
Figure 5S:
Figure 5S:
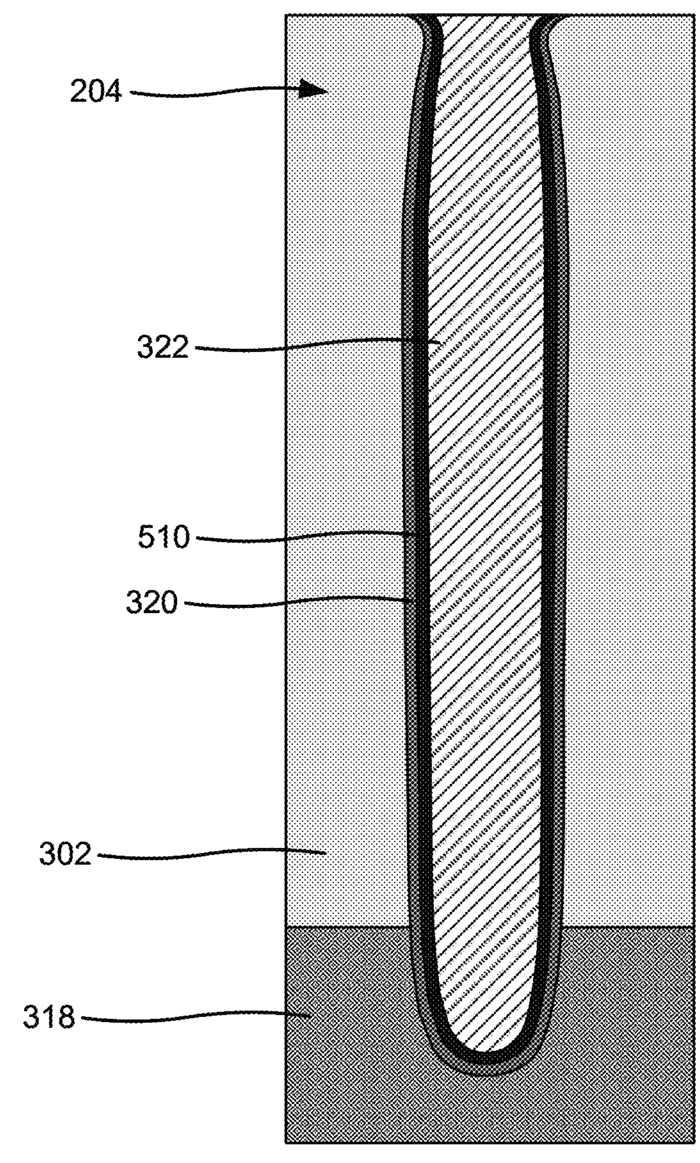
Figure 5T:
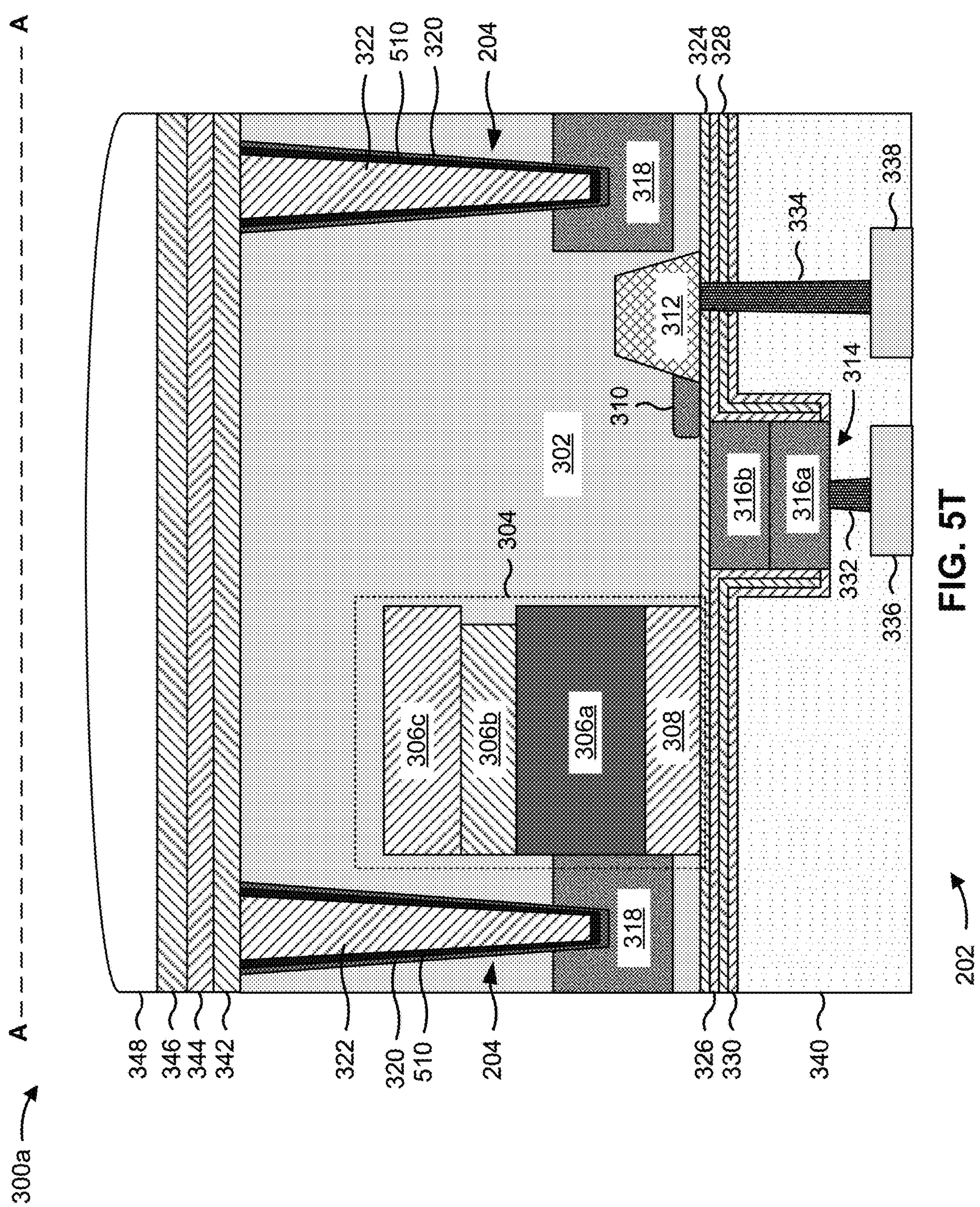

FIGS. 5A-5T are diagrams of an example implementation 500 described herein. Example implementation 500 may be an example process for forming a pixel sensor 202 described herein, such as the pixel sensor 202 described in connection with FIGS. 3A and 3B. One or more of FIGS. 5A-5T are illustrated along the cross-section A-A of the pixel array 200 in FIG. 2. As shown in FIG. 5A, the example process for forming the pixel sensor 202 may be performed in connection with the substrate 302.

As shown in FIG. 5B, the DPW 318 may be formed in the substrate 302. For example, the deep p-well region 318 may be formed (e.g., as a circle or ring shape in a top-down view) in the substrate 302 to provide electrical isolation and/or optical isolation for the pixel sensor 202. In some implementations, the ion implantation tool 114 dopes the substrate 302 by ion implantation to form the deep p-well region 318. For example, the ion implantation tool 114 may implant $p^+$ ions into a first region of the substrate 302 to form the deep p-well region 318. In some implementations, the ion implantation tool 114 dopes a portion of the substrate 302 above the deep p-well region 318 with $p^+$ ions to form a CPW above and/or over the deep p-well region 318. In some implementations, the substrate 302 may be doped using another doping technique such as diffusion to form the deep p-well region 318.

As shown in FIGS. 5C and 5D, a plurality of regions of the substrate 302 may be doped to form the photodiode 304. For example, and as illustrated in the example in FIG. 5C, the substrate 302 may be doped to form one or more n-type regions **306*b* and 306*c*. As another example, and as illustrated in the example in FIG. 5D, the substrate 302 may be doped to form an n-type region 306*a* and a p-type region 308**.

In some implementations, the ion implantation tool 114 dopes the plurality of regions of the substrate 302 by one or more ion implantation operations. For example, the ion implantation tool 114 may implant $p^+$ ions in the substrate 302 to form the p-type region 308, may implant $n^+$ ions in the substrate to form the n-type region **306*a* over and/or on the p-type region 308, may implant $n^+$ ions in the substrate 302 to form the n-type region 306*b* above and/or over the n-type region 306*a*, and/or may implant $n^+$ ions in the substrate 302 to form the n-type region 306*c* above and/or over the n-type region 306*b* for a BS-DTI-CIS pixel sensor. As another example, the ion implantation tool 114 may implant $n^+$ ions in the substrate 302 to form the n-type region 306*c*, may implant $n^+$ ions in the substrate 302 to form the n-type region 306*b* above and/or over the n-type region 306*c*, may implant $n^+$ ions in the substrate 302 to form the n-type region 306*a* above and/or over the n-type region 306*b*, and may implant $p^+$ ions in the substrate 302 to form the p-type region 308 above and/or over the n-type region 306*a* for a FS-DTI-CIS pixel sensor. The ion implantation tool 114 may form the n-type region 306*a*, the n-type region 306*b*, the n-type region 306*c*, and the p-type region 308 within the perimeter of the deep p-well region 318. In some implementations, the plurality of regions of the substrate 302 may be doped using another doping technique such as diffusion to form the photodiode 304. In some implementations, the n-type region 306*a*, the n-type region 306*b*, and/or the n-type region 306*c*** may be doped with different n-type dopant concentrations.

As shown in FIG. 5E, a plurality of regions of the substrate 302 may be doped to form the drain extension region 310 and the drain region 312. In some implementations, the ion implantation tool 114 dopes the plurality of regions of the substrate 302 by one or more ion implantation operations. For example, the ion implantation tool 114 may implant $n^+$ ions in the substrate 302 to form the drain region 312, and may implant $n^+$ ions in the substrate 302 adjacent to the drain region 312 to form the drain extension region

310. The ion implantation tool 114 may form the drain region 312 and the drain extension region 310 within the perimeter of the deep p-well region 318. In some implementations, the plurality of regions of the substrate 302 may be doped using another doping technique such as diffusion to form the drain region 312 and/or the drain extension region 310. In some implementations, the drain extension region 310 and the drain region 312 may be doped with different n-type dopant concentrations.

As shown in FIG. 5F, the gate dielectric layer 324 may be formed above and/or over the frontside surface of the substrate 302. The deposition tool 102 may deposit the gate dielectric layer 324 using a CVD technique, a PVD technique, an ALD technique, or another type of deposition technique. The planarization tool 110 may planarize the gate dielectric layer 324 after the gate dielectric layer 324 is deposited.

As shown in FIG. 5G, the transfer gate 314 may be formed over and/or on the gate dielectric layer 324. Moreover, the transfer gate 314 may be formed such that the transfer gate 314 is above and between the photodiode 304 and the drain region 312. This enables the transfer gate 314 to selectively form a conductive channel in the substrate 302 between the photodiode 304 and the drain region 312 to control the flow of electrons from the photodiode 304 to the drain region 312.

Forming the transfer gate 314 may include forming the lower transfer gate electrode region **316*b* over and/or on the gate dielectric layer 324, and forming the n-doped upper transfer gate electrode region 316*a* over and/or on the lower transfer gate electrode region 316*b*. The deposition tool 102 may deposit the n-doped upper transfer gate electrode region 316*a* and/or the lower transfer gate electrode region 316*b* using a CVD technique, a PVD technique, an ALD technique, an epitaxy technique, or another type of deposition technique; the plating tool 112 may deposit the transfer gate 314 in an electroplating operation; or a combination thereof. In some implementations, the ion implantation tool 114 forms the n-doped upper transfer gate electrode region 316*a* and/or the lower transfer gate electrode region 316*b* using one or more ion implantation operations. In some implementations, the planarization tool 110 planarizes the n-doped upper transfer gate electrode region 316*a* and/or the lower transfer gate electrode region 316*b* after formation of the n-doped upper transfer gate electrode region 316*a* and/or the lower transfer gate electrode region 316*b***.

As shown in FIG. 5H, the sidewall oxide layer 326 may be formed over and/or on the gate dielectric layer 324, on the sidewalls of the n-doped upper transfer gate electrode region **316*a*, and on the sidewalls of the lower transfer gate electrode region 316*b*. The deposition tool 102 may deposit the sidewall oxide layer 326 using a CVD technique, a PVD technique, an ALD technique, or another type of deposition technique. In some implementations, the deposition tool 102 deposits the sidewall oxide layer 326 using a conformal deposition technique. In some implementations, the planarization tool 110 planarizes the sidewall oxide layer 326 after the sidewall oxide layer 326** is deposited.

As further shown in FIG. 5H, the remote plasma oxide (RPO) layer 328 may be formed over and/or on the sidewall oxide layer 326, over the sidewalls of the n-doped upper transfer gate electrode region **316*a*, and over the sidewalls of the lower transfer gate electrode region 316*b*. The deposition tool 102 may deposit the remote plasma oxide layer 328 using a CVD technique, a PVD technique, an ALD technique, or another type of deposition technique. In some implementations, the deposition tool 102 deposits the remote plasma oxide layer 328 using a conformal deposition technique. In some implementations, the planarization tool 110 planarizes the remote plasma oxide layer 328 after the remote plasma oxide layer 328** is deposited.

As further shown in FIG. 5H, the contact etch stop layer (CESL) 330 may be formed over and/or on the remote plasma oxide layer 328, over the sidewalls of the n-doped upper transfer gate electrode region **316*a*, and over the sidewalls of the lower transfer gate electrode region 316*b*. The deposition tool 102 may deposit the contact etch stop layer 330 using a CVD technique, a PVD technique, an ALD technique, or another type of deposition technique. In some implementations, the deposition tool 102 deposits the contact etch stop layer 330 using a conformal deposition technique. In some implementations, the planarization tool 110 planarizes the contact etch stop layer 330 after the contact etch stop layer 330** is deposited.

As shown in FIG. 5I, the dielectric layer(s) 340 may be formed over and/or on the layers 324-330, and over and/or on the transfer gate 314. The deposition tool 102 may deposit the dielectric layer(s) 340 using a CVD technique, a PVD technique, and LAD technique, and/or another deposition technique.

As shown in FIG. 5J, the etch tool 108 forms openings 502 in the dielectric layer(s) 340. The etch tool 108 may form an opening 502 over the transfer gate 314 and through the dielectric layer(s) 340 to the transfer gate 314. The etch tool 108 may also form another opening 502 over the drain region 312 and through the dielectric layer(s) 340 to the drain region 312.

As shown in FIG. 5K, the interconnects 332 and 334 may be formed in the openings 502 in the dielectric layer(s) 340. The interconnect 332 may be formed such that the interconnect 332 is electrically connected with and/or contacts the transfer gate 314 (e.g., the n-doped upper transfer gate electrode region **316*a* of the transfer gate 314). The interconnect 334 may be formed such that the interconnect 334 is electrically connected with and/or contacts the drain region 312. The deposition tool 102 may deposit the material of the interconnects 332 and 334 using a CVD technique, a PVD technique, an ALD technique, or another type of deposition technique, the plating tool 112 may deposit the material of the interconnects 332 and 334 using an electroplating operation, or a combination thereof. The planarization tool 110 may planarize the interconnects 332 and 334 after the interconnects 332 and 334** are deposited.

As shown in FIG. 5L, the metallization layers 336 and 338 may be formed in the openings 502 in the dielectric layer(s) 340. In particular, the metallization layer 336 may be electrically connected to the transfer gate 314 by the interconnect 332, and the metallization layer 338 may be electrically connected to the drain region 312 by the interconnect 334. The deposition tool 102 may deposit the material of the metallization layers 336 and 338 using a CVD technique, a PVD technique, an ALD technique, or another type of deposition technique, the plating tool 112 may deposit the material of the metallization layers 336 and 338 using an electroplating operation, or a combination thereof. The planarization tool 110 may planarize the metallization layers 336 and 338 after the metallization layers 336 and 338 are deposited.

As shown in FIG. 5M, backside processing of the pixel sensor 202 may be performed. As part of the backside processing, the substrate 302 above the deep p-well region 318 may be etched to form a trench 504 (or another type of recess) in the substrate 302. The trench 504 may be etched into the substrate 302 from the backside surface of the substrate 302, which may be an opposing side of the substrate 302 on which the transfer gate 314 is formed. The trench 504 may be formed such that the trench 504 surrounds the one or more n-type regions 306, the p-type region 308, the drain extension region 310, the drain region 312, and the transfer gate 314. In some implementations, the trench 504 is formed such that the trench 504 partially extends into the deep p-well region 318.

The deposition tool 102 may form a photoresist layer on the substrate 302, the exposure tool 104 may expose the photoresist layer to a radiation source to pattern the photoresist layer, the developer tool 106 may develop and remove portions of the photoresist layer to expose the pattern, and the etch tool 108 may etch portions of the substrate 302 (and, in some cases, portions of the deep p-well region 318) to form the trench 504. In some implementations, a photoresist removal tool removes the remaining portions of the photoresist layer (e.g., using a chemical stripper, a plasma asher, and/or another technique) after the etch tool 108 etches the substrate 302 (and, in some cases, the deep p-well region 318) to form the trench 504.

As shown in FIG. 5N, the trench 504 may be lined with a liner layer 320. The deposition tool 102 may form the liner layer 320 by conformal deposition such that the liner layer 320 is formed as a thin film that conforms to the shape and/or profile of the sidewalls and bottom surface of the trench 504. The liner layer 320 may an aluminum oxide (or another type of metal oxide). The deposition tool 102 may form the liner layer 320 with a thickness in a range from approximately 10 Ångstroms (Å) to approximately 70 Å. By selecting a thickness of at least 10 Å, reflectivity of a DTI structure 204 including the liner layer 320 is improved. By selecting a thickness of no more than 70 Å, the DTI structure 204 including the liner layer 320 will still include enough silicon oxide material to effectively insulate the photodiode 304.

As shown in FIG. 5O, the deposition tool 102 may conformally deposit a doping layer 506 on sidewalls of the trench 504 and on a bottom surface of the trench 504. In some implementations, the doping layer 506 includes a nitride, such as a titanium nitride (TiN), that includes fluorine atoms. Accordingly, the deposition tool 102 may use a titanium precursor, such as titanium chloride ($TiCl_4$), with an ammonia ($NH_3$) carrier and with a fluorine-based co-reactant. For example, the deposition tool 102 may form the doping layer 506 using ALD at a temperature that is in a range from approximately 350 degrees Celsius (° C.) to approximately 450° C. By selecting a temperature of at least 350° C., the carrier may remain gaseous in order to deposit the doping layer 506 on a bottom surface of the trench 504. By selecting a temperature of no more than 450° C., other portions of the pixel sensor 202 are not significantly modified by the ALD. In some implementations, the deposition tool 102 may form the doping layer 506 to a thickness that is in a range from approximately 10 Å to approximately 20 Å. By selecting a thickness of at least 10 Å, sufficient fluorine is present for driving into the liner layer 320, as described in connection with FIG. 5P. By selecting a thickness of no more than 20 Å, the doping layer 506 may be removed, as described in connection with FIG. 5Q, without significant etching of other portions of the pixel sensor 202.

Additionally, or alternatively, the doping layer 506 includes tungsten (W) with fluorine atoms. Accordingly, the deposition tool 102 may use a tungsten precursor, such as tungsten fluoride ($WF_6$), with a diborane ($B_2H_6$) carrier. For example, the deposition tool 102 may form the doping layer 506 using ALD at a temperature that is in a range from approximately 350° C. to approximately 450° C. By selecting a temperature of at least 350° C., the carrier may remain gaseous in order to deposit the doping layer 506 on a bottom surface of the trench 504. By selecting a temperature of no more than 450° C., other portions of the pixel sensor 202 are not significantly modified by the ALD. In some implementations, the deposition tool 102 may form the doping layer 506 to a thickness that is in a range from approximately 40 Å to approximately 60 Å. By selecting a thickness of at least 40 Å, sufficient fluorine is present for driving into the liner layer 320, as described in connection with FIG. 5P. By selecting a thickness of no more than 60 Å, the doping layer 506 may be removed, as described in connection with FIG. 5Q, without significant etching of other portions of the pixel sensor 202.

Alternatively, the doping layer 506 includes a fluorosilicate glass (FSG). Accordingly, the deposition tool 102 may use silicon precursors, such as silane ($SiH_4$) and silicon tetrafluoride ($SiF_4$), with an oxygen ($O_2$) carrier. For example, the deposition tool 102 may form the doping layer 506 using high density plasma (HDP) at a temperature that is in a range from approximately 350° C. to approximately 450° C. By selecting a temperature of at least 350° C., the carrier may remain gaseous in order to deposit the doping layer 506 on a bottom surface of the trench 504. By selecting a temperature of no more than 450° C., other portions of the pixel sensor 202 are not significantly modified by the HDP. In some implementations, the deposition tool 102 may form the doping layer 506 to a thickness that is in a range from approximately 50 Å to approximately 100 Å. By selecting a thickness of at least 50 Å, sufficient fluorine is present for driving into the liner layer 320, as described in connection with FIG. 5P. By selecting a thickness of no more than 100 Å, the doping layer 506 may be removed, as described in connection with FIG. 5Q, without significant etching of other portions of the pixel sensor 202.

As shown in FIG. 5P, the ion implantation tool 114 may drive fluorine atoms from the doping layer 506 into the liner layer 320 using a plasma 508. For example, the ion implantation tool 114 may use a hydrogen ($H_2$) plasma. For example, the ion implantation tool 114 may bombard the doping layer 506 with hydrogen plasma at a temperature that is in a range from approximately 350° C. to approximately 450° C. By selecting a temperature of at least 350° C., the plasma is sufficiently energized in order to drive the fluorine atoms into the liner layer 320. By selecting a temperature of no more than 450° C., other portions of the pixel sensor 202 are not significantly modified by the ion implantation tool 114. Using the doping layer 506 to drive fluorine atoms into the liner layer 320 results in significant doping, which further reduces dangling silicon bonds at the interface between the liner layer 320 and the substrate 302.

As shown in FIG. 5Q, the doping layer 506 may be removed. For example, the etch tool 108 may perform a wet etching operation (e.g., using hydrogen peroxide ($H_2O_2$) and/or hydrogen fluoride (HF)) to remove the doping layer 506. The etch tool 108 may perform the wet etch for an amount of time proportional to a thickness of the doping layer 506, such that the liner layer 320 is not significantly etched during the wet etch process.

Instead of using the doping layer 506, some implementations may use a nitrogen trifluoride ($NF_3$) soak. For example, the deposition tool 104 may perform a remote plasma treatment at a temperature that is in a range from approximately 350° C. to approximately 450° C. By selecting a temperature of at least 350° C., the plasma is sufficiently energized in order to deposit fluorine residue over the liner layer 320. By selecting a temperature of no more than 450° C., other portions of the pixel sensor 202 are not significantly modified by the remote plasma treatment. Because the $NF_3$ soak leaves fluorine residue over the liner layer 320, the ion implantation tool 114 may drive fluorine atoms from the residue into the liner layer 320, as described in connection with FIG. 5P. Using the $NF_3$ soak allows the etching described in connection with FIG. 5Q to be omitted, which conserves raw materials and reduces manufacturing time.

In some implementations, and as shown in FIG. 5R, the deposition tool 102 may conformally deposit one or more additional layers 510 on sidewalls of the trench 504 and on a bottom surface of the trench 504. In some implementations, the layer(s) 510 includes an oxide, such as a hafnium oxide (HfO). Accordingly, the deposition tool 102 may form the oxide using ALD at a temperature that is in a range from approximately 350° C. to approximately 450° C. By selecting a temperature of at least 350° C., a carrier may remain gaseous in order to deposit the oxide on a bottom surface of the trench 504. By selecting a temperature of no more than 450° C., other portions of the pixel sensor 202 are not significantly modified by the ALD. In some implementations, the deposition tool 102 may form the oxide to a thickness that is in a range from approximately 10 Å to approximately 70 Å. By selecting a thickness of at least 10 Å, reflectivity of a DTI structure 204 including the oxide is improved. By selecting a thickness of no more than 70 Å, the DTI structure 204 including the oxide will still include enough silicon oxide material to effectively insulate the photodiode 304.

Additionally, or alternatively, the layer(s) 510 includes a high-κ material, such as a tantalum oxide ($Ta_2O_5$). Accordingly, the deposition tool 102 may form the high-κ material using ALD at a temperature that is in a range from approximately 350° C. to approximately 450° C. By selecting a temperature of at least 350° C., a carrier may remain gaseous in order to deposit the high-κ material on a bottom surface of the trench 504. By selecting a temperature of no more than 450° C., other portions of the pixel sensor 202 are not significantly modified by the ALD. In some implementations, the deposition tool 102 may form the high-κ material to a thickness that is in a range from approximately 400 Å to approximately 600 Å. By selecting a thickness of at least 400 Å, reflectivity of a DTI structure 204 including the high-κ material is improved. By selecting a thickness of no more than 600 Å, the DTI structure 204 including the high-κ material will still include enough silicon oxide material to effectively insulate the photodiode 304.

As shown in FIG. 5S, the trench 504 may be filled with an oxide material to form an oxide layer 322 of the DTI structure 204. The deposition tool 102 may form the oxide layer 322 over the liner layer 320 (and/or the layer(s) 510). The deposition tool 102 may deposit the oxide layer 322 using a CVD technique, a PVD technique, an ALD technique, or another type of deposition technique. In some implementations, the deposition tool 102 uses an PEALD technique to form the oxide layer 322. The planarization tool 110 may planarize the oxide layer 322 after the oxide layer 322 is deposited in the trench 504 such that a top surface of the oxide layer 322 and a backside surface of the substrate 302 are approximately a same height.

As shown in FIG. 5T, additional layers and/or structures may be formed for the pixel sensor 202. For example, a $p^+$ ion layer 342, an ARC 344, a color filter layer 346, and a micro-lens layer 348 may be formed over the backside side of the substrate 302 (e.g., over the one or more layers 320 on the backside of the substrate 302). The deposition tool 102 may deposit the $p^+$ ion layer 342, the ARC 344, the color filter layer 346, and the micro-lens layer 348 using a CVD technique, a PVD technique, an ALD technique, or another type of deposition technique. The $p^+$ ion layer 342 may be formed over and/or on the substrate 302. The ARC 344 may be formed over and/or on the $p^+$ ion layer 342. The color filter layer 346 may be formed over and/or on the ARC 344. The micro-lens layer 348 may be formed over and/or on the color filter layer 346. In some implementations, the planarization tool 110 planarizes the $p^+$ ion layer 342, the ARC 344, and/or the color filter layer 346.

As indicated above, FIGS. 5A-5T are provided as an example. Other examples may differ from what is described with regard to FIGS. 5A-5T.

Figure 6:
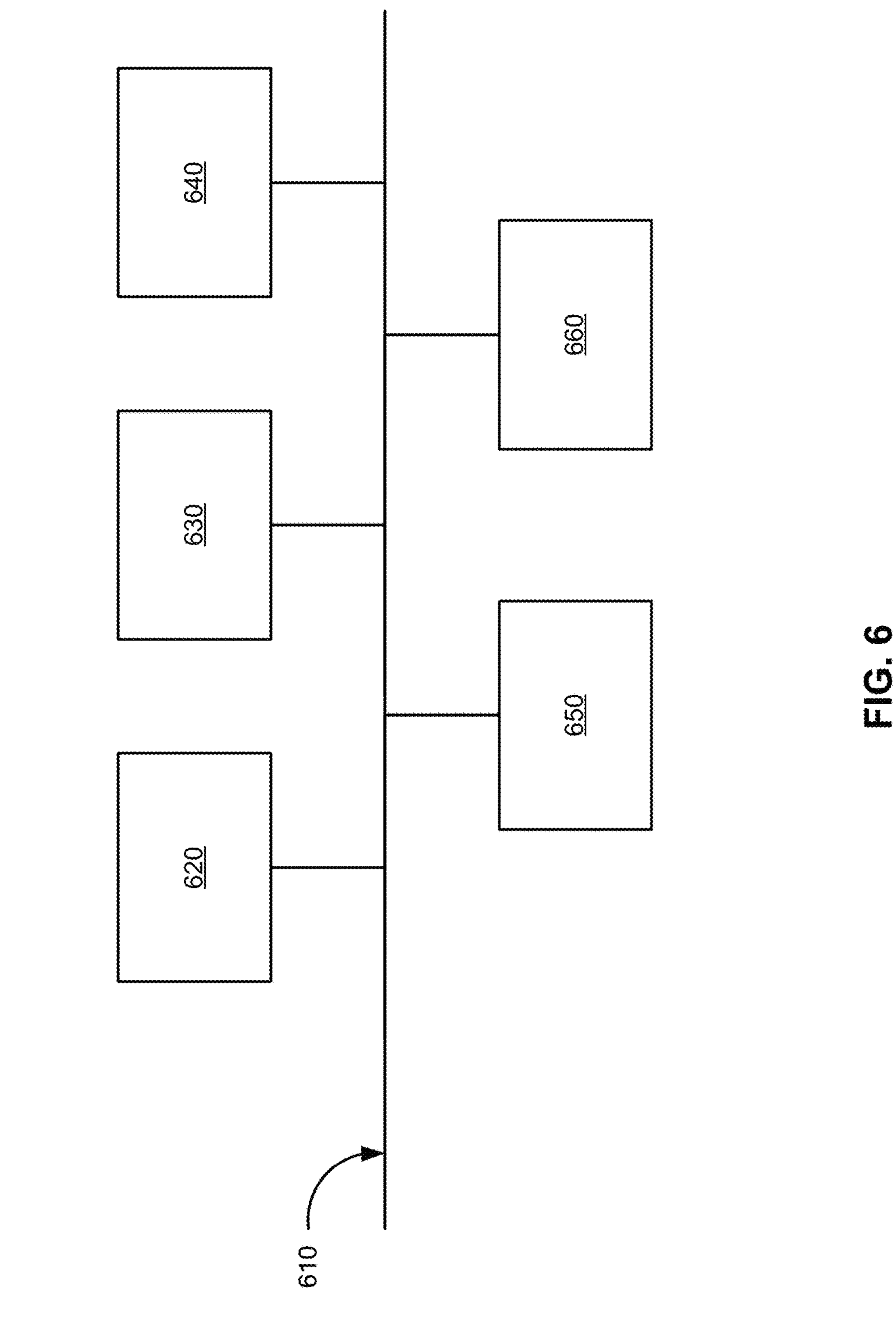
FIG. 6 is a diagram of example components of one or more devices of FIG. 1 described herein.

FIG. 6 is a diagram of example components of a device 600. In some implementations, one or more of the semiconductor processing tools 102-116 and/or the wafer/die transport tool 118 may include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
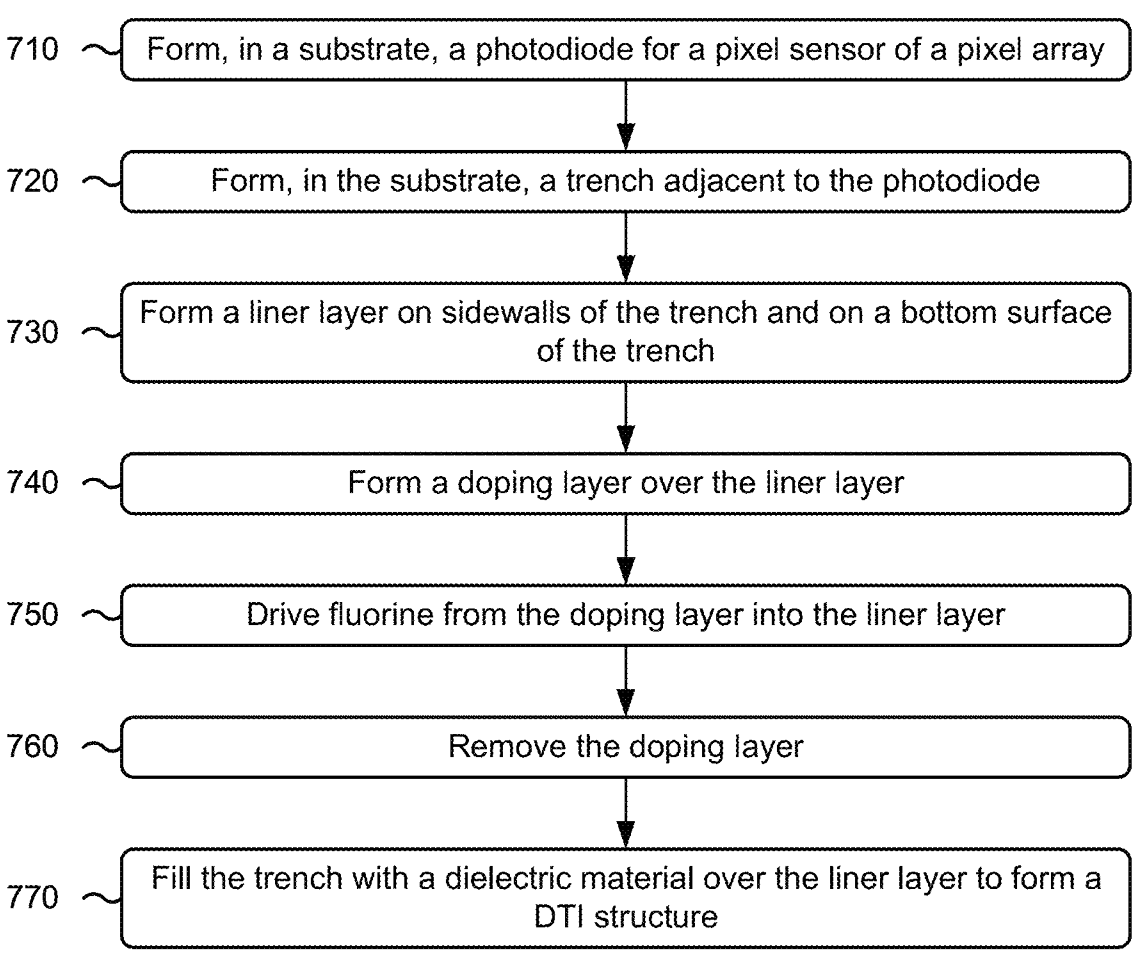
FIGS. 7 and 8 are flowcharts of example processes associated with forming a pixel sensor described herein.

FIG. 7 is a flowchart of an example process 700 associated with forming semiconductor isolation structures described herein. In some implementations, one or more process blocks of FIG. 7 are performed by one or more semiconductor processing tools (e.g., one or more of the semiconductor processing tools 102-116). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming, in a substrate, a photodiode for a pixel sensor of a pixel array (block 710). For example, one or more of the semiconductor processing tools 102-116 may form, in a substrate 302, a photodiode 304 for a pixel sensor 202 of a pixel array 200, as described herein.

As further shown in FIG. 7, process 700 may include forming, in the substrate, a trench adjacent to the photodiode (block 720). For example, one or more of the semiconductor processing tools 102-116 may form, in the substrate 302, a trench 504 adjacent to the photodiode 304, as described herein.

As further shown in FIG. 7, process 700 may include forming a liner layer on sidewalls of the trench and on a bottom surface of the trench (block 730). For example, one or more of the semiconductor processing tools 102-116 may form a liner layer 320 on sidewalls of the trench 504 and on a bottom surface of the trench 504, as described herein.

As further shown in FIG. 7, process 700 may include forming a doping layer over the liner layer (block 740). For example, one or more of the semiconductor processing tools 102-116 may form a doping layer 506 over the liner layer 320, as described herein.

As further shown in FIG. 7, process 700 may include driving fluorine from the doping layer into the liner layer (block 750). For example, one or more of the semiconductor processing tools 102-116 may drive fluorine from the doping layer 506 into the liner layer 320, as described herein.

As further shown in FIG. 7, process 700 may include removing the doping layer (block 760). For example, one or more of the semiconductor processing tools 102-116 may remove the doping layer 506, as described herein.

As further shown in FIG. 7, process 700 may include filling the trench with a dielectric material over the liner layer to form a DTI structure (block 770). For example, one or more of the semiconductor processing tools 102-116 may fill the trench 504 with a dielectric material 322 over the liner layer 320 to form a DTI structure 204, as described herein.

Process 700 may include additional implementations, such as any single implementation or any combination of implementations described below and/or in connection with one or more other processes described elsewhere herein.

In a first implementation, driving the fluorine into the liner layer 320 results in fluorine-silicon bonds at an interface between the liner layer 320 and the substrate 302.

In a second implementation, alone or in combination with the first implementation, the doping layer 506 includes a titanium nitride, tungsten, or a combination thereof.

In a third implementation, alone or in combination with one or more of the first and second implementations, the doping layer 506 includes an FSG.

In a fourth implementation, alone or in combination with one or more of the first through third implementations, removing the doping layer 506 includes performing a wet etch process to remove the doping layer 506.

In a fifth implementation, alone or in combination with one or more of the first through fourth implementations, process 700 includes forming an oxide layer 510 over the liner layer 320, such that the dielectric material 322 is over the oxide layer 510 in the DTI structure 204.

In a sixth implementation, alone or in combination with one or more of the first through fifth implementations, process 700 includes forming a high-κ layer 510 over the liner layer 320, such that the dielectric material 322 is over the high-κ layer 510 in the DTI structure 204.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Figure 8:
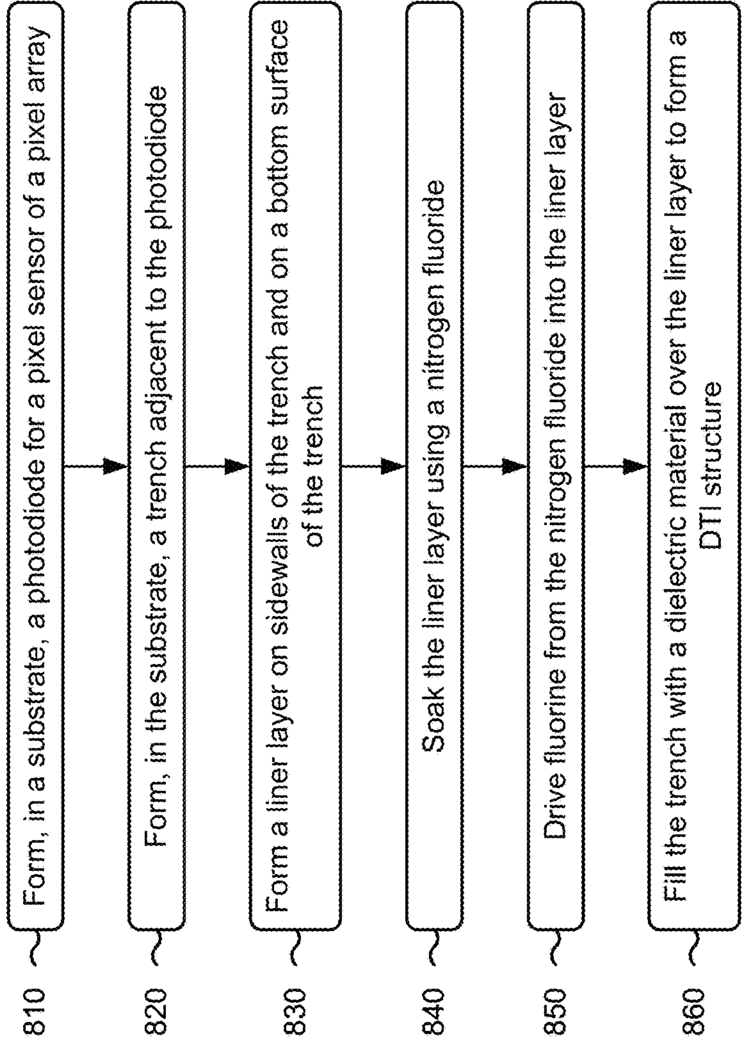

FIG. 8 is a flowchart of an example process 800 associated with forming semiconductor isolation structures described herein. In some implementations, one or more process blocks of FIG. 8 are performed by one or more semiconductor processing tools (e.g., one or more of the semiconductor processing tools 102-116). Additionally, or alternatively, one or more process blocks of FIG. 8 may be performed by one or more components of device 600, such as processor 620, memory 630, input component 640, output component 650, and/or communication component 660.

As shown in FIG. 8, process 800 may include forming, in a substrate, a photodiode for a pixel sensor of a pixel array (block 810). For example, one or more of the semiconductor processing tools 102-116 may form, in a substrate 302, a photodiode 304 for a pixel sensor 202 of a pixel array 200, as described herein.

As further shown in FIG. 8, process 800 may include forming, in the substrate, a trench adjacent to the photodiode (block 820). For example, one or more of the semiconductor processing tools 102-116 may form, in the substrate 302, a trench 504 adjacent to the photodiode 304, as described herein.

As further shown in FIG. 8, process 800 may include forming a liner layer on sidewalls of the trench and on a bottom surface of the trench (block 830). For example, one or more of the semiconductor processing tools 102-116 may form a liner layer 320 on sidewalls of the trench 504 and on a bottom surface of the trench 504, as described herein.

As further shown in FIG. 8, process 800 may include soaking the liner layer using a nitrogen fluoride (block 840). For example, one or more of the semiconductor processing tools 102-116 may soak the liner layer 320 using a nitrogen fluoride, as described herein.

As further shown in FIG. 8, process 800 may include driving fluorine from the nitrogen fluoride into the liner layer (block 850). For example, one or more of the semiconductor processing tools 102-116 may drive fluorine from the nitrogen fluoride into the liner layer 320, as described herein.

As further shown in FIG. 8, process 800 may include filling the trench with a dielectric material over the liner layer to form a DTI structure (block 860). For example, one or more of the semiconductor processing tools 102-116 may fill the trench 504 with a dielectric material 322 over the liner layer 320 to form a DTI structure 204, as described herein.

Process 800 may include additional implementations, such as any single implementation or any combination of implementations described below and/or in connection with one or more other processes described elsewhere herein.

In a first implementation, driving the fluorine into the liner layer 320 includes using a hydrogen plasma at a temperature that is in a range from approximately 300° C. to approximately 400° C.

In a second implementation, alone or in combination with the first implementation, soaking the liner layer 320 includes using a nitrogen trifluoride plasma at a temperature that is in a range from approximately 350° C. to approximately 450° C., such that the nitrogen trifluoride plasma results in fluorine residue on the liner layer 320.

In a third implementation, alone or in combination with one or more of the first and second implementations, driving the fluorine into the liner layer 320 results in fluorine-silicon bonds at an interface between the liner layer 320 and the substrate 302.

In a fourth implementation, alone or in combination with one or more of the first through third implementations, process 800 includes forming an oxide layer 510 over the liner layer 320 using ALD at a temperature that is in a range from approximately 350° C. to approximately 450° C.

In a fifth implementation, alone or in combination with one or more of the first through fourth implementations, process 800 includes forming a high-κ layer 510 over the liner layer 320 using ALD at a temperature that is in a range from approximately 350° C. to approximately 450° C.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

In this way, doping a liner of a trench isolation structure with fluorine (F) reduces dark current from a photodiode. For example, the fluorine may be added to a passivation layer surrounding a BDTI structure. As a result, sensitivity of the photodiode is increased. Additionally, breakdown voltage of the photodiode is increased, and a quantity of white pixels in a pixel array including the photodiode are reduced.

As described in greater detail above, some implementations described herein provide a pixel sensor. The pixel sensor includes a silicon substrate. The pixel sensor includes a photodiode in the silicon substrate. The pixel sensor includes a deep trench isolation (DTI) structure in the silicon substrate, where the DTI structure is adjacent to the photodiode and electrically insulates the photodiode, and where the DTI structure comprises: a liner layer doped with fluorine, and a dielectric formed over the liner layer.

As described in greater detail above, some implementations described herein provide a method. The method includes forming, in a substrate, a photodiode for a pixel sensor of a pixel array. The method includes forming, in the substrate, a trench adjacent to the photodiode. The method includes forming a liner layer on sidewalls of the trench and on a bottom surface of the trench. The method includes forming a doping layer over the liner layer. The method includes driving fluorine from the doping layer into the liner layer. The method includes removing the doping layer. The method includes filling the trench with a dielectric material over the liner layer to form a deep trench isolation (DTI) structure.

As described in greater detail above, some implementations described herein provide a method. The method includes forming, in a substrate, a photodiode for a pixel sensor of a pixel array. The method includes forming, in the substrate, a trench adjacent to the photodiode. The method includes forming a liner layer on sidewalls of the trench and on a bottom surface of the trench. The method includes soaking the liner layer using a nitrogen fluoride. The method includes driving fluorine from the nitrogen fluoride into the liner layer. The method includes filling the trench with a dielectric material over the liner layer to form a deep trench isolation (DTI) structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming, in a substrate, a photodiode for a pixel sensor of a pixel array;

forming, in the substrate, a trench adjacent to the photodiode;

forming an oxide liner layer to be in direct contact with sidewalls of the trench and to be in direct contact with a bottom surface of the trench;

forming a doping layer to be in direct contact with the oxide liner layer;

driving fluorine from the doping layer into the oxide liner layer by bombarding the doping layer with a plasma;

removing the doping layer;

forming, after removing the doping layer, an oxide layer to be in direct contact with the oxide liner layer; and filling the trench with a dielectric material over the oxide layer to form a deep trench isolation (DTI) structure.

2. The method of claim 1, wherein driving the fluorine into the oxide liner layer results in fluorine-silicon bonds at an interface between the oxide liner layer and the substrate.

3. The method of claim 1, wherein the doping layer comprises a titanium nitride, tungsten, or a combination thereof.

4. The method of claim 1, wherein the doping layer comprises a fluorosilicate glass (FSG).

5. The method of claim 1, wherein removing the doping layer comprises:

performing a wet etch process to remove the doping layer.

6. The method of claim 1, wherein the oxide layer is a high-κ layer, wherein the dielectric material is formed over the high-κ layer in the DTI structure.

7. The method of claim 1, wherein the doping layer is bombarded with the plasma at a temperature that is in a range from 350° C. to 450° C.

8. The method of claim 1, wherein the plasma is a hydrogen plasma.

9. The method of claim 1, wherein the oxide layer is formed at a temperature that is in a range from 350° C. to 450° C.

10. A device, comprising:

one or more memories; and one or more processors, coupled to the one or more memories, configured to:

form, in a substrate, a photodiode for a pixel sensor of a pixel array;

form, in the substrate, a trench adjacent to the photodiode;

form an oxide liner layer to be in direct contact with sidewalls of the trench and to be in direct contact with a bottom surface of the trench;

form a doping layer to be in direct contact with the oxide liner layer;

bombard the doping layer with a plasma to drive fluorine from the doping layer into the oxide liner layer;

remove the doping layer;

form, after the doping layer is removed, an oxide layer to be in direct contact with the oxide liner layer; and fill the trench with a dielectric material over the oxide liner layer to form a deep trench isolation (DTI) structure.

11. The device of claim 10, wherein the one or more processors are further configured to:

form fluorine-silicon bonds at an interface between the oxide liner layer and the substrate based on the fluorine being driven into the oxide liner layer.

12. The device of claim 10, wherein the doping layer comprises a titanium nitride, tungsten, or a combination thereof.

13. The device of claim 10, wherein the doping layer comprises a fluorosilicate glass (FSG).

14. The device of claim 10, wherein the one or more processors, to remove the doping layer, are configured to:

perform a wet etch process.

15. The device of claim 10, wherein the oxide layer is a high-κ layer.

16. A non-transitory computer-readable medium storing a set of instructions, the set of instructions comprising:

one or more instructions that, when executed by one or more processors of a device, cause the device to:

form, in a substrate, a photodiode for a pixel sensor of a pixel array;

form, in the substrate, a trench adjacent to the photodiode;

form an oxide liner layer to be in direct contact with sidewalls of the trench and to be in direct contact with a bottom surface of the trench;

form a doping layer to be in direct contact with the oxide liner layer;

bombard the doping layer with a plasma to drive fluorine from the doping layer into the oxide liner layer;

remove the doping layer;

form, after the doping layer is removed, an oxide layer to be in direct contact with the oxide liner layer; and fill the trench with a dielectric material over the oxide liner layer to form a deep trench isolation (DTI) structure.

17. The non-transitory computer-readable medium of claim 16, wherein the one or more instructions further configured cause the device to:

form fluorine-silicon bonds at an interface between the oxide liner layer and the substrate based on the fluorine being driven into the oxide liner layer.

18. The non-transitory computer-readable medium of claim 16, wherein the doping layer comprises a titanium nitride, tungsten, or a combination thereof.

19. The non-transitory computer-readable medium of claim 16, wherein the doping layer comprises a fluorosilicate glass (FSG).

20. The non-transitory computer-readable medium of claim 16, wherein the one or more instructions, that cause the device to remove the doping layer, cause the device to:

perform a wet etch process.

* * * * *